United States Patent
Takenaka et al.

(10) Patent No.: US 8,263,878 B2
(45) Date of Patent: Sep. 11, 2012

(54) PRINTED WIRING BOARD

(75) Inventors: Yoshinori Takenaka, Ibi-gun (JP);
Takeshi Nakamura, Ibi-gun (JP);
Takamitsu Hattori, Ibi-gun (JP)

(73) Assignee: Ibiden Co., Ltd., Ogaki (JP)

( * ) Notice: Subject to any disclaimer, the term of this patent is extended or adjusted under 35 U.S.C. 154(b) by 600 days.

(21) Appl. No.: 12/355,201

(22) Filed: Jan. 16, 2009

(65) Prior Publication Data
US 2009/0242261 A1 Oct. 1, 2009

Related U.S. Application Data

(60) Provisional application No. 61/039,228, filed on Mar. 25, 2008.

(51) Int. Cl.
*H05K 1/11* (2006.01)
(52) U.S. Cl. ........................................ 174/262
(58) Field of Classification Search ............... 174/262
See application file for complete search history.

(56) References Cited

U.S. PATENT DOCUMENTS

| | | | | |
|---|---|---|---|---|
| 5,450,290 A | * | 9/1995 | Boyko et al. | 361/792 |
| 5,451,722 A | * | 9/1995 | Gregoire | 174/261 |
| 6,184,479 B1 | * | 2/2001 | Okabe et al. | 174/262 |
| 6,591,495 B2 | * | 7/2003 | Hirose et al. | 29/846 |
| 6,828,510 B1 | * | 12/2004 | Asai et al. | 174/255 |
| 7,262,082 B1 | * | 8/2007 | Lin et al. | 438/109 |
| 7,943,861 B2 | * | 5/2011 | Iwai et al. | 174/262 |
| 2005/0088833 A1 | | 4/2005 | Kikuchi et al. | |
| 2008/0317402 A1 | | 12/2008 | Kodama et al. | |

FOREIGN PATENT DOCUMENTS

| | | |
|---|---|---|
| JP | 10-200236 | 7/1998 |
| JP | 2003-163323 | 6/2003 |
| JP | 2003-347459 | 12/2003 |
| JP | 2004-235323 | 8/2004 |
| JP | 2006-19591 | 1/2006 |
| JP | 2008-166736 | 7/2008 |
| WO | WO 2007/074567 A1 | 7/2007 |

* cited by examiner

*Primary Examiner* — Chau Nguyen
(74) *Attorney, Agent, or Firm* — Oblon, Spivak, McClelland, Maier & Neustadt, L.L.P.

(57) ABSTRACT

A printed wiring board disperses stress throughout an inner conductor layer, ensuring the flatness of a substrate. Embedding wires into the outermost insulating layer and forming the wires in a tapered shape that widens downward reduces the amount of stress applied on the edge of the inner conductor layer. This also prevents cracks from forming within the insulating layer, while maintaining favorable yield rates. Via diameters may also be reduced to increase circuit density.

19 Claims, 23 Drawing Sheets

(k=1, 2)

PRINTED WIRING BOARD

CROSS-REFERENCE TO RELATED APPLICATION

The present application claims the benefit of priority to U.S. Application No. 61/039,228, filed Mar. 25, 2008, the entire contents of which are incorporated herein by reference.

BACKGROUND

1. Field of the Invention

The present invention relates to a printed wiring board having a thin profile while maintaining sufficient flatness, and associated manufacturing methodology.

2. Background Art

With recent advancements toward high-function electronic equipment, there has been an increasing demand for smaller and thinner products. Along with rapid advancements in high-density integration of electronic parts such as IC chips and LSI used for such electronic equipment, there has been a need to further increase the wiring density of package substrates (hereinafter referred to as "PKG substrate") for loading these electronic parts to achieve smaller and thinner profiles.

Typically, these PKG substrates employ a reinforced member, such as a glass-fabric copper-clad laminate as a core substrate, and have a configuration in which a buildup layer is formed in both top and bottom surfaces of the core substrate. A through-hole on the core substrate is formed to interconnect the buildup layers of both surfaces. The diameter of these through-holes, or vias, determine the circuit density (i.e. how closely circuit wires may be placed in relation to each other) that can be achieved on the PKG substrates. The smallest possible diameter of the through-holes is determined at least by the core substrate.

To reduce through-hole diameter, a multilayer printed wiring board without a core substrate has been proposed. In one conventional example a multilayer printed wiring board (hereinafter referred to as "conventional example") is manufactured by laminating an interlayer material and a conductor layer alternately on a metallic foil surface on a support substrate to form a buildup layer. Then a predefined portion from the circumference of the buildup layer is removed, and the support substrate and the buildup layer are separated so that the metallic foil remains on both the buildup layer and the support substrate. The remaining metallic foil on the buildup layer is etched to form a BGA pad. Japanese Unexamined Patent Application Publication 2006-19591, the entire contents of which is incorporated herein, provides one such conventional example.

SUMMARY

One aspect of the invention is a printed wiring board that includes a first insulating layer having a first surface and a second surface that opposes the first surface. The first insulating layer also includes a concave portion formed on the first surface side, and an aperture that extends from the first surface to the second surface. The printed wiring board also includes a first conductor circuit formed in the concave portion of the first insulating layer. At least one side of the first conductor is tapered from the first surface to the second surface of the first insulating layer. A conductive pad that connects to an electronic part is formed on the second surface, and a first via conductor is formed in the aperture of the first insulating layer in order to interconnect the conductive pad to the first conductor circuit.

Another aspect of the invention is a printed wiring board that includes a first insulating layer having a first surface and a second surface that opposes the first surface. The first insulating layer also includes a first concave portion in the first surface side, and a second concave portion in the second surface side. An aperture extends from the first surface to the second surface. The printed wiring board also includes a first conductive circuit that is formed in the first concave portion of the first insulating layer. At least one side of the first conductive circuit is tapered from the first surface towards the second surface of the first insulating layer. A conductive pad, formed in the second concave portion, connects to an electronic part, and a first via conductor, formed in the aperture of the first insulating layer, interconnects the conductive pad to the first conductive circuit.

A further aspect of the invention is a printed circuit board manufacturing method. The method includes forming a conductive pad that connects to an electronic part on a second surface of an outermost insulating layer. The outermost insulating layer also has a first surface that opposes the second surface. The method also includes forming an aperture that penetrates the outermost insulating layer. Then the method includes forming a concave portion in the first surface side of the outermost insulating layer. A first conductive circuit that has at least one side tapered from the first surface to the second surface of the outermost insulating layer is formed in the concave portion. A first via conductor that electrically connects the conductive pad to the first conductive circuit is formed in the aperture. In the method, a surface of the first conductor is formed substantially flush with the first surface of the first insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1A:
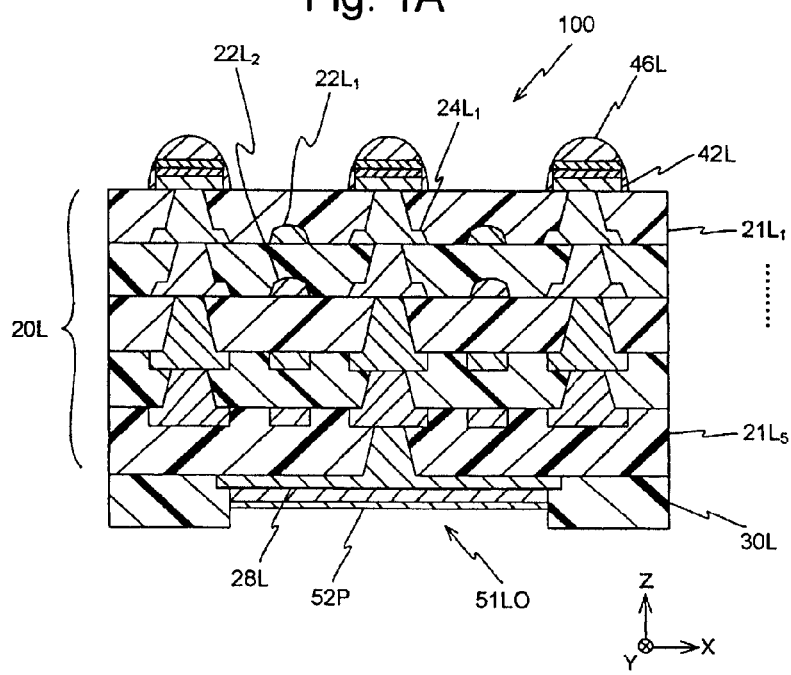
FIG. 1A is a cross-sectional view that schematically shows a configuration of a printed wiring board according to a first embodiment of the present invention.

The multilayer printed wiring board described in the conventional example above reduces overall thickness by omitting a core substrate. However, in the conventional example of a multiplayer printed wiring board, the wiring formed in the surface of the resin insulating layer can cause the resin insulating layer to warp and form a series of concaves and convexes on the printed wiring board. Such warping increases when the resin insulating layer and the wiring are laminated in alternation. Low density of the wiring may also increase warping of the resin insulating layer.

The concaves and convexes due to warping of the resin insulating layer can cause variations in the height of the solder pads located on the outermost layer (uppermost layer). Due to these variations in the height of the solder pad, the distance between the solder pad and the electronic parts becomes unequal, thereby causing stress on specific solder bumps. These stressed solder bumps become more susceptible to fatigue degradation, resulting in decreased manufacturing yield and implementation reliability of the electronic parts.

Another conventional method embeds the wiring into the resin insulating layer. However, if the wiring is embedded into the resin insulating layer of a printed wiring board without a core substrate, heat from a semiconductor device may upwardly warp the printed wiring board, causing a convex region under the semiconductor device.

On the multilayer printed wiring board, a semiconductor device is loaded via a solder pad on the outermost layer of the board. A gap between the semiconductor device and the multilayer printed wiring board is often filled with underfill resin, dividing the resin insulating layer that forms the printed wiring board between one part where the underfill resin is applied, and another part where the underfill resin is not applied when a semiconductor device with a lower heat expansion coefficient than the resin insulating layer is integrated with the resin insulating layer via the underfill resin, the degree of heat expansion of the resin insulating layer can vary between the part where the underfill resin is applied and the part where the underfill resin is not applied. This variation in heat expansion is particularly apparent on the resin insulating layer that is the uppermost layer most adjacent to the semiconductor device.

The heat expansion of the resin insulating layer under the projection domain of the semiconductor device is constrained by the heat expansion coefficient of the semiconductor device. Therefore, expansion of this part of the resin insulating layer is significantly small compared to the part outside the projection domain of the semiconductor device. Even in the same resin insulating layer, heat expansion of the center part (the inner part where the semiconductor device is loaded) is smaller than that of the outer part where the semiconductor device is not loaded.

Therefore, if, for example, warpage occurs in the multilayer printed wiring board, among the resin insulating layers constituting the multilayer printed wiring board (in particular, the uppermost resin insulating layer), inner stress occurs to the part with underfill resin (projection domain of the semiconductor device) due to the constrained heat expansion. Such inner stress can concentrate on the edge of the conductor circuit embedded in the resin insulating layer, and spread within the resin insulating layer starting from the edge of the conductor circuit as a base point, causing cracks within the resin insulating layer.

According to a first aspect of the present invention, a printed wiring board includes a resin insulating layer having a first concave portion for a first conductor circuit formed in a first surface side and a first aperture for a first via conductor. A first conductor circuit is formed in the first concave portion, and a parts loading pad is formed on a second surface located opposite to the first surface in the resin insulating layer to load electronic parts. A first via conductor is formed in the aperture to connect the part loading pad and the first conductor circuit, wherein a side of the first conductor circuit is tapered toward the parts loading pad.

For the first printed wiring board, it is preferable to further include at least one layer of a second resin insulating layer laminated on the first surface of the resin insulating layer, wherein a second concave portion for forming the second conductor circuit is formed on the first surface side, and a second aperture for the second via conductor is formed. A second conductor circuit formed in the second concave portion; and a second via conductor for interlayer connection between the second conductor circuit and the first conductor circuit, wherein the side surface of the second conductor circuit is preferably tapered toward the parts loading pad.

In addition, for the first printed wiring board of the present invention, the upper side of the first conductor circuit is preferably arc-shaped, and the surface of the first conductor circuit is preferably aligned to approximately the same plane as (i.e. substantially flush with) the first surface of the resin insulating layer.

When the first printed wiring board of the present invention further includes the second resin insulating layer and the second via conductor as mentioned above, it is preferable to also include a third resin insulating layer that is laminated in the first surface of the second resin insulating layer, where a third aperture for the third via conductor is formed. A third conductor circuit is formed in the first surface of the third resin insulating layer, and a third via conductor for interlayer connection between the third conductor circuit and the second conductor circuit is also formed.

Herein, the line:space ratio of the first conductor circuit is preferably smaller than that of the third conductor circuit.

For the first printed wiring board of the present invention, the surface of the resin insulating layer that forms the first concave portion and the first aperture is preferably roughened.

According to a second aspect of the present invention, a printed wiring board includes a resin insulating layer having a first concave portion for a first conductor circuit formed in the first surface side, a second concave portion for a parts loading pad formed in the second surface side located opposing to the first surface, and a first aperture for a first via conductor. A first conductor circuit is formed in the first concave portion, and a parts loading pad is formed in the second concave portion. A first via conductor is formed in the aperture to connect the parts loading pad and the first conductor circuit, wherein a side surface of the first conductor circuit is tapered toward the parts loading pad.

The second printed wiring board of the present invention also includes a second resin insulating layer laminated on the first surface of the resin insulating layer, wherein the second concave portion for forming the second conductor circuit is formed in the first surface side and the second aperture for the second via conductor is formed. A second conductor circuit is formed in the second concave portion, and a second via conductor formed in the second aperture for an interlayer connection between the second conductor circuit and the first conductor circuit, wherein a side surface of the second conductor circuit is preferably tapered toward the parts loading pad.

In addition, for the second printed wiring board of the present invention, the upper side of the first conductor circuit is preferably arc-shaped, and the surface of the first conductor circuit is preferably aligned to substantially the same plane as the first surface of the resin insulating layer.

When the second printed wiring board of the present invention further includes the second resin insulating layer and the second via conductor as mentioned above, it is preferable that it also include a third resin insulating layer laminated in the first surface of the second resin insulating layer having a third aperture for the third via conductor. A third conductor circuit is formed in the first surface of the third resin insulating layer, and a third via conductor is formed in the third aperture for an interlayer connection between the third conductor circuit and the second conductor circuit.

Herein, the line:space ratio of the first conductor circuit is preferably smaller than that of the third conductor circuit.

In addition, for the second printed wiring board of the present invention, the surface of the resin insulating layer that forms the first concave portion and the first aperture is preferably roughened. Furthermore, in the surface of the pad, it is preferable that a protective film is formed. Herein, the protective film preferably has a surface located on approximately the same plane as the second surface of the resin insulating layer.

According to a third aspect of the present invention, a method for manufacturing a printed wiring board includes a process of forming a conductor part to be an electronic parts loading pad in the second surface side of the first resin insulating layer that is the outermost resin insulating layer. Also included are a process of forming a first aperture part for the first via conductor that penetrates the first resin insulating layer, as well as forming a first concave portion for the first conductor circuit in the first surface side of the first resin insulating layer. Next, a process of forming a first conductor circuit having a side surface tapered toward the conductor part within the first concave portion so that its surface is exposed to approximately the same plane as the first surface of the first resin insulating layer, and a process of forming a first via conductor in the first aperture to electrically connect the first conductor circuit and the conductor part are included in the method.

In the method for manufacturing a printed wiring board of the present invention, it is preferable that a process of forming the first concave portion and the first aperture by laser also be included. In the process of forming the first concave portion and the first aperture by laser, the first concave portion is preferably formed by an excimer laser and the first aperture is preferably formed by a carbon dioxide gas laser.

In the method for manufacturing a printed wiring board of the present invention, it is preferable that it further include a process of laminating at least one layer of a second resin insulating layer in a first surface of the first resin insulating layer, and a process of forming a second aperture for a second via conductor that penetrates the second resin insulating layer as well as forming a second concave portion for a second conductor circuit in the first surface side of the second resin insulating layer. A process of forming a second conductor circuit having a side tapered toward the conductor part within the second concave portion so that its surface is aligned to approximately the same plane as the first surface of the second resin insulating layer, and a process of forming a second via conductor in the second aperture to electrically connect the first conductor circuit and the second conductor circuit are also included.

Herein, it is preferable that the method also include a process of laminating at least one layer of a third resin insulating layer in a first surface of the second resin insulating layer, and a process of forming a third aperture for a third via conductor that penetrates the third resin insulating layer. It is also preferable that the method include a process of forming a third conductor circuit in a first surface of the third resin insulating layer, and a process of forming a third via conductor for an interlayer connection between the third conductor circuit and the second conductor circuit.

The abovementioned configurations enable the manufacture of a printed wiring board with excellent flatness.

The difficulty of downsizing through holes formed on core substrates limits the wiring density of PKG substrates. In addition, the presence of the core substrate increases the overall thickness of the PKG substrate, leaving the abovementioned demand for thinner and smaller profiles unmet.

The flexible printed wiring board according to embodiments of the present invention is useful as a thin printed wiring board for use in devices requiring thin profiles. Furthermore, an associated methodology for manufacturing the flexible printed wiring board according to the present invention prevents cracks from forming inside the resin insulating layer, while maintaining favorable yields.

In an exemplary embodiment of the present invention, the pads to which electronic components attach are at approximately equal heights, which enable improvement in of the implementation yield of the electronic parts. In addition, it becomes possible to approximately equalize the distance between the pad and the electrodes of the electronic parts. Consequently, stress may be prevented from concentrating on any specific pad, leading to higher connection reliability.

Further, the embedded conductors in the printed wiring board according to an exemplary embodiment of this invention may be finely pulled when a high degree of precision is required, and formed using a semi-additive method when a high degree of precision is not required. In this context, "fine pulling" a conductor involves using a laser to form a concave portion (i.e. groove) in an insulating substrate, and embedding a conductive material therein. Employing such processes of forming wiring can provide a printed wiring board with higher productivity than cases in which all wirings are formed through an embedding process, and it also meets the needs for pulling the wiring around. This method can also reduce cost.

Examples of the printed wiring board of the present invention and electronic parts will be explained below in detail as a first and second embodiment with reference to FIGS. 1-10.

Embodiment 1

FIG. 1 is a drawing that shows the positional relationship between the printed wiring board 100 according to a first embodiment of the present invention, the laminate part 20L constituting the printed wiring board 100, the solder member (solder bump) 46L to which an electronic part attaches, and the solder resist 30L.

Herein, the solder member 46L is formed on the pad 42L provided on the surface in the +Z direction side of the outermost resin insulating layer 21L1 that is formed in the +Z direction of the laminate part 20L. The solder resist 30L is provided in the surface on the −Z direction side of the outer-most layer that is formed in the −Z direction side of the laminate part 20L. In addition, on the solder resist 30L, the aperture 51LO is provided so that the pad 28L, which is part of the wiring pattern, is exposed. Furthermore, inside the laminate part 20L, the inner layer conductor circuit 22Lj (j=1−N) and the via conductor 24Lj for an interlayer connection are provided.

The printed wiring board 100 comprises: (a) the laminate part 20L made of a plurality of insulating layers 21Lj; (b) the pad 42L formed in the surface on the +Z direction side of the outermost layer among the resin insulating layers constituting the laminate part 20L; (c) the solder resist 30L formed in the surface on the −Z direction side of the laminate part 20L.

The laminate part 20L comprises: (i) a resin insulating layer 21Lj (j=1−N, wherein N=5 in the present embodiment); (ii) a conductor layer having an inner layer conductor circuit (wiring pattern) 22Lj; and (iii) a via conductor 24Lj for an interlayer connection to connect between the conductor circuits formed on different conductor layers.

Certain inner layer conductor circuits 22Lj are configured to be embedded into the resin insulating layer to form a schematic plane with the −Z direction surface (the first surface) of each resin insulating layer. Others are configured to be formed on the +Z direction side (the second surface) of each resin insulating layer.

The printed wiring board 100 further comprises: (iv) a solder member 46L provided on the pad 42L; (v) an aperture 51LO provided in the solder resist 30L; and (vi) a pad 28L exposed from the aperture 51LO.

In FIG. 1A, on the resin insulating layer 21L1 constituting the uppermost layer, the first concave portion is provided on the −Z direction side (the first surface). The first concave portion is opened in the first surface of the resin insulating layer 21L1. In addition, the surface of the resin insulating layer 21L1 that forms the first concave portion is roughened. Within the first concave portion, the conductor circuit 22L1 is formed, wherein the surface of the conductor circuit 22L1 and the first surface of the resin insulating layer 21L1 are aligned to approximately the same plane (i.e. substantially flush).

Herein, the side of the conductor circuit 22L1 is tapered toward the pad 42L. That is, the width of the conductor circuit 22L1 is increased downward (−Z direction). In the conductor circuit 22L1, the width t, which is equivalent to the opening of the first concave portion, is the widest. Additional widening by the roughening the surface of the resin insulating layer 21L1 that forms the concave portion is ignored for purposes of describing the invention.

Figure 1B:
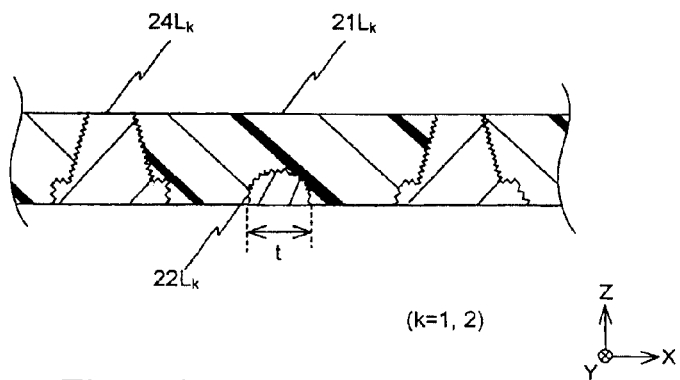
FIG. 1B is a diagram that magnifies a part of the cross-sectional view of a printed wiring board along the X1-X1 plane according to the first embodiment.
Figure 1C:
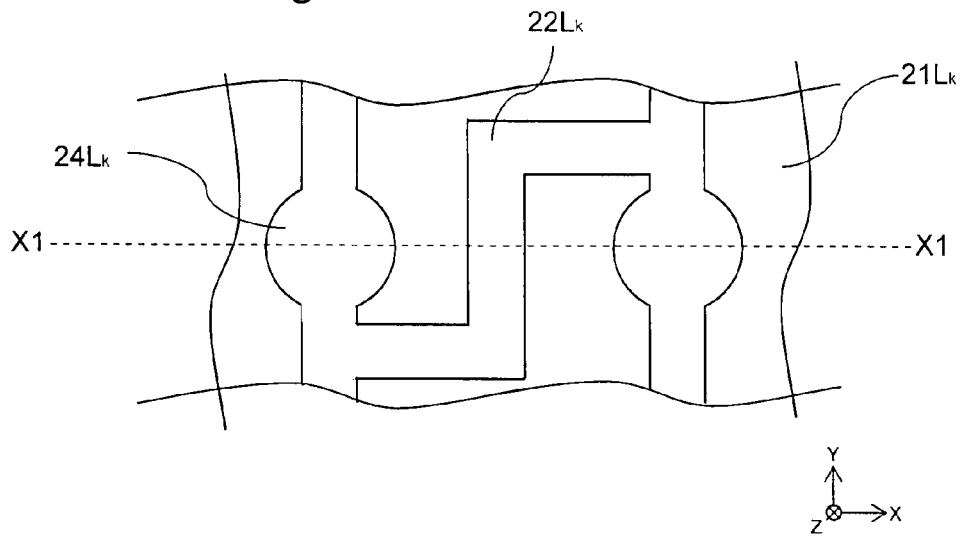
FIG. 1C is a magnified plan view of the part of the printed wiring board shown in FIG. 1 B according to the first embodiment.

In addition, in FIG. 1, the resin insulating layer 21L2 located directly below the resin insulating layer 21L1 that constitutes the uppermost layer has the same abovementioned configuration as the resin insulating layer 21L1, and the conductor circuit 22L2 is connected to the conductor circuit 22L1 through the via conductor 24L1 24L2 formed inside the resin insulating layer 21L2 (see FIG. 1A, FIG. 1B, FIG. 1C).

Next, a method of manufacturing the printed wiring board 100 of the first embodiment will be explained with reference to a case of using a support member that has a conductor layer formed on both sides.

Figure 2A:
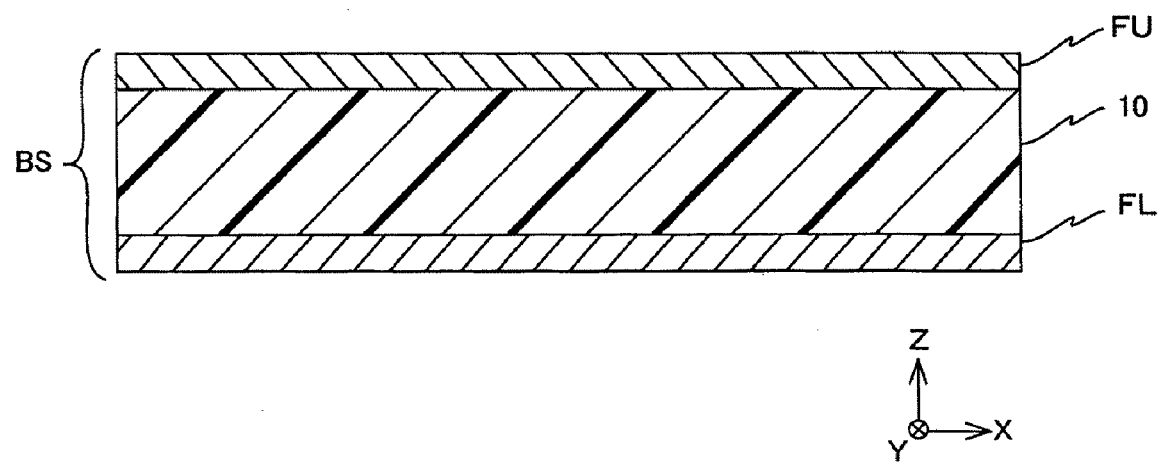
FIG. 2A is a process chart (No. 1) that shows a process for manufacturing a printed wiring board according to the first embodiment.

When manufacturing the printed wiring board 100, a support member BS is first prepared (see FIG. 2A). The support member BS includes an insulating member 10 and conductor layers FU and FL formed on both sides of the insulating member 10. The conductor layers FU and FL are formed with metallic foil having a thickness ranging from several μm to several dozen μm.

Examples of the insulating member 10 include a glass board material bismaleimide triazine resin immersed laminate sheet, a glass board material polyphenylene ether resin immersed laminate sheet, and a glass board material polyimide resin immersed laminate sheet. Copper foil or any other metallic foil may be fixed to both surfaces using a known method.

Commercially available double-sided copper clad laminates and one-sided clad laminates may also be used. Examples of such commercially available products include MCL-E679 FGR (by Hitachi Chemical, Co., Ltd.) and others. A metal plate can also be used as a support member BS.

Figure 2B:
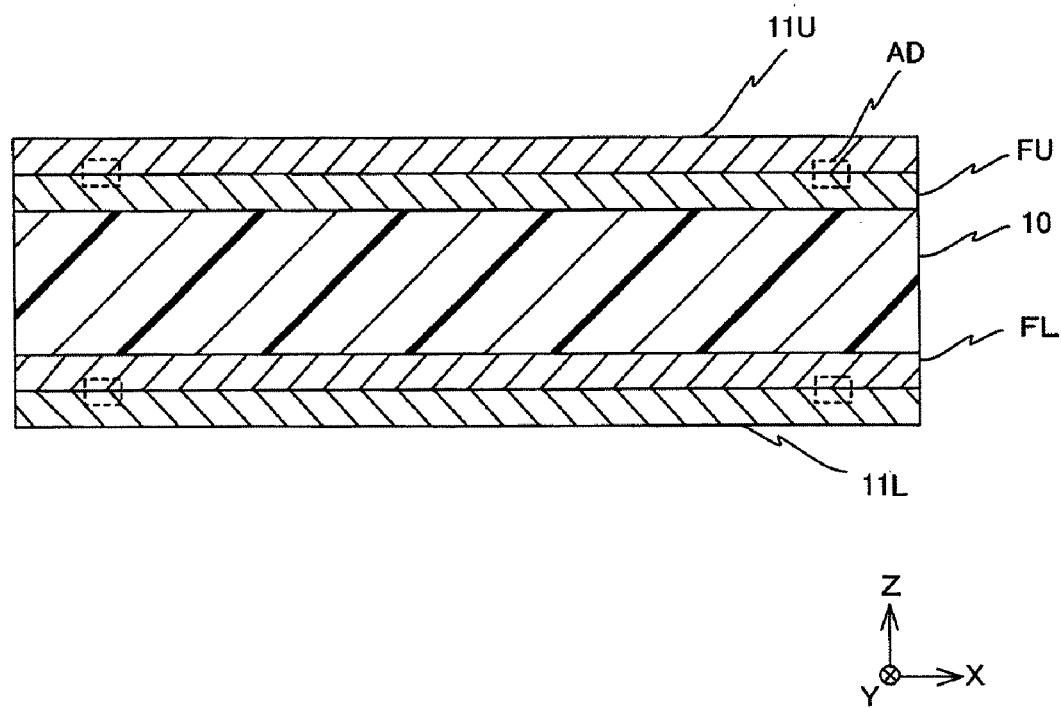
FIG. 2B is a process chart (No. 2) that shows a process for manufacturing a printed wiring board according to the first embodiment.

Firstly, as shown in FIG. 2B, in the first and second surfaces of the support member BS, the first surfaces of the metallic foil 11U and 11L are each laminated. Examples of the metallic foil used herein may include copper foil, nickel foil, and titanium foil. The second surfaces of these metallic foils are preferably a mat surface. The second surface of the metallic foil refers to the surface opposite to the first surface, and is oriented in the +Z direction. When using a copper foil as the abovementioned metallic foil, a thickness of 3-35 µm is suitable.

In order to enable subsequent processes, these metallic foils 11U and 11L are preferably joined or bonded using ultrasound or adhesive agents with the conductor layers FU and FL formed on the insulating member 10 at a desired site AD (adjacent to the edge). As a means of fixing the conductor layer (support substrate) and the metallic foil, taking into consideration the adhesion intensity and convenience of both, it is preferable to use ultrasound.

Figure 2C:
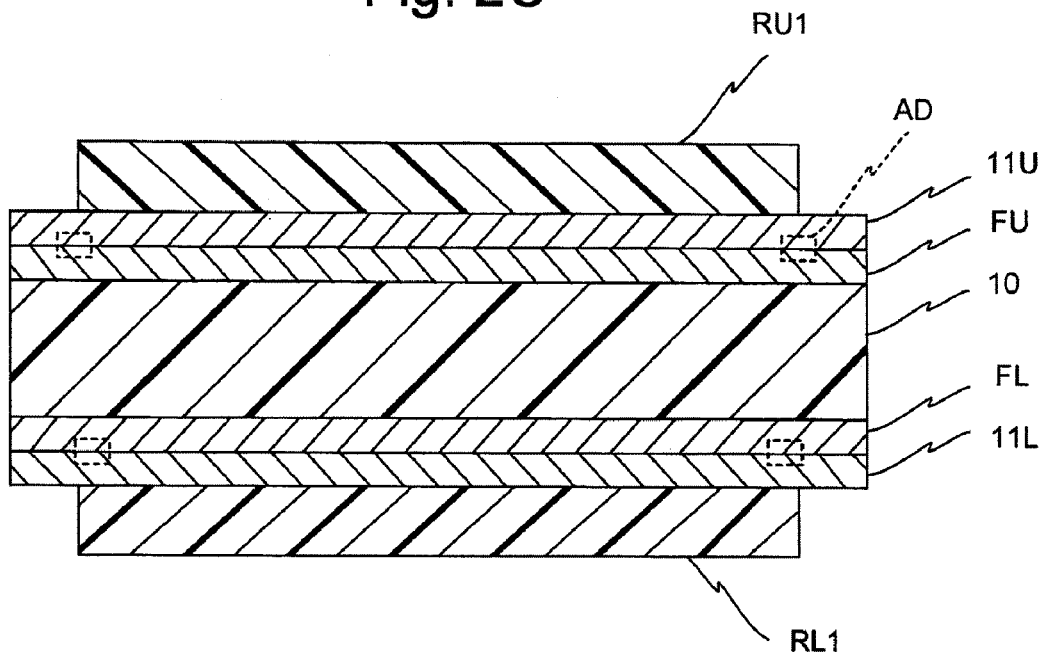
FIG. 2C is a process chart (No. 3) that shows a process for manufacturing a printed wiring board according to the first embodiment.

Next, as shown in FIG. 2C, etching resists RU1 and RL1 are formed to partially overlap with the joint part AD between the conductor layers FU, FL and the metallic foils 11U, 11L. For example, these resists RU1 and RL1 can be formed by using a commercially available dry film resist or liquid resist.

Figure 2D:
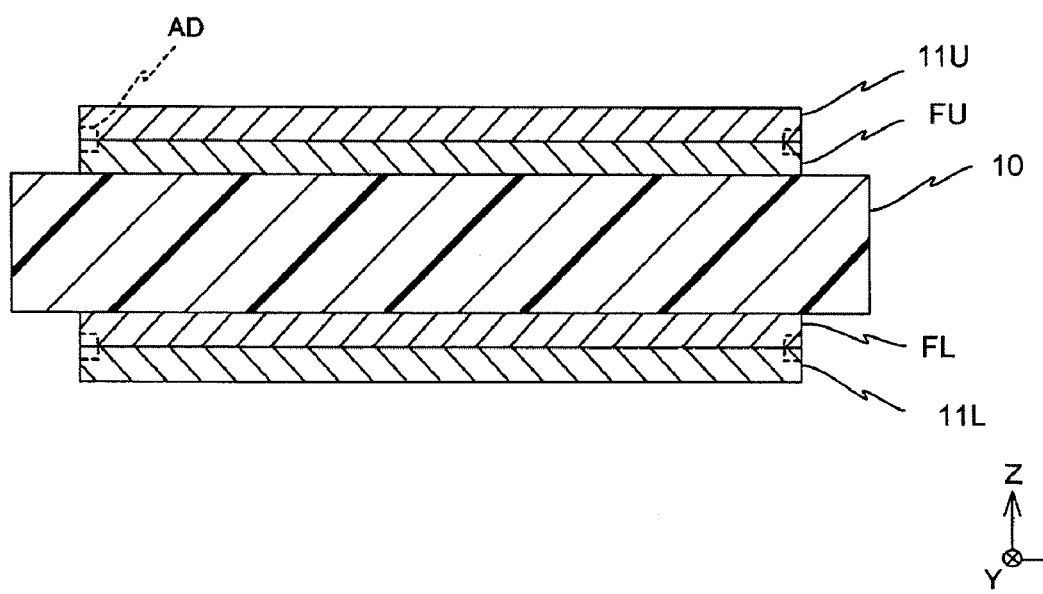
FIG. 2D is a process chart (No. 4) that shows a process for manufacturing a printed wiring board according to the first embodiment.

Next, as shown in FIG. 2D, the conductor layer (a metallic foil) FU of the part on which the resist RU1 is not formed, the metallic foil 11U and the metallic foils FL and 11L of the part on which the resist RL1 is not formed are removed by etching with the use of known methods. The resists RU1 and RL1 are then removed through any conventional method.

Figure 3A:
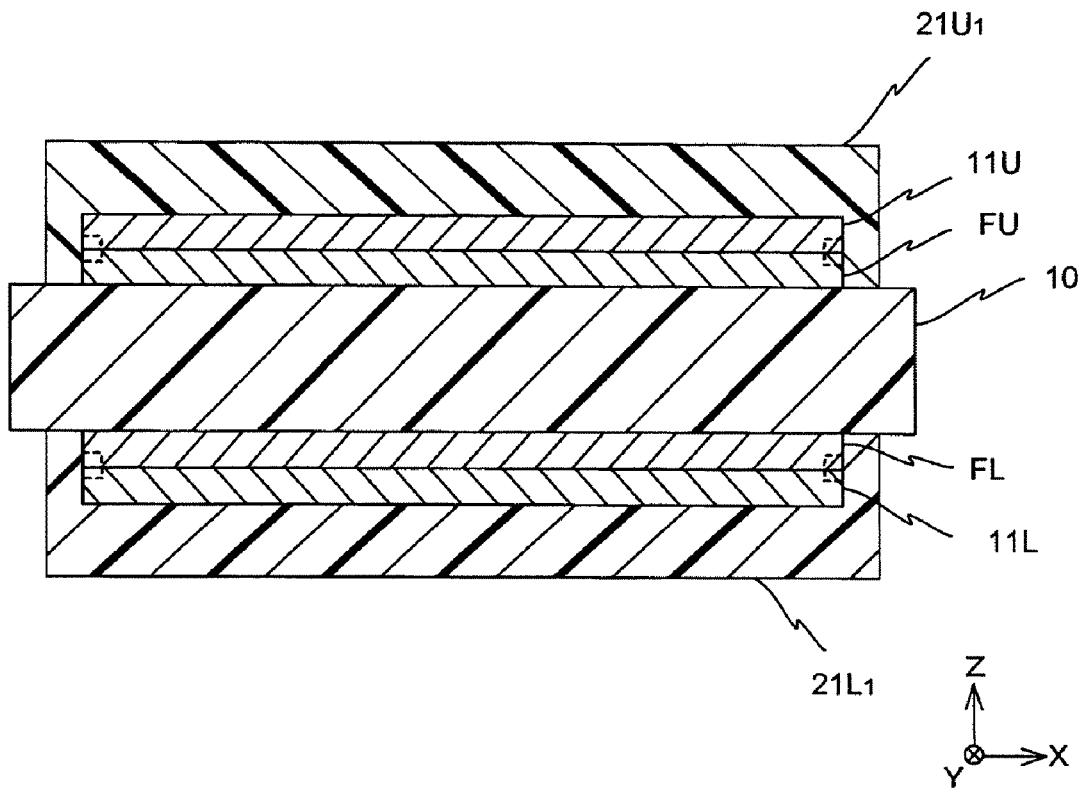
FIG. 3A is a process chart (No. 5) that shows a process for manufacturing a printed wiring board according to the first embodiment.

Next, as shown in FIG. 3A, a resin insulating layer (a resin insulating layer formed on the support member 10) 21U1 is formed to cover the first surface of the insulating member 10 and the metallic foils FU and 11U. In addition, a resin insulating layer (a rein insulating layer formed on the core) 21L1 is formed to cover the second surface of the insulating member 10 and the metallic foils FL and 11L. This insulating layer is for ultimately forming the uppermost insulating layer of each multilayer printed wiring board.

Materials that can be used for this resin insulating layer include interlayer insulation films, prepregs, and other partially hardened resin sheets. Unhardened liquid resin may also be screen-printed on the abovementioned metallic foil to form the resin insulating layer. In the present embodiment, such interlayer insulating film can be, for example, ABF series interlayer film for buildup wiring boards (made by Ajinomoto Fine-Techno Co., Inc.).

Figure 3B:
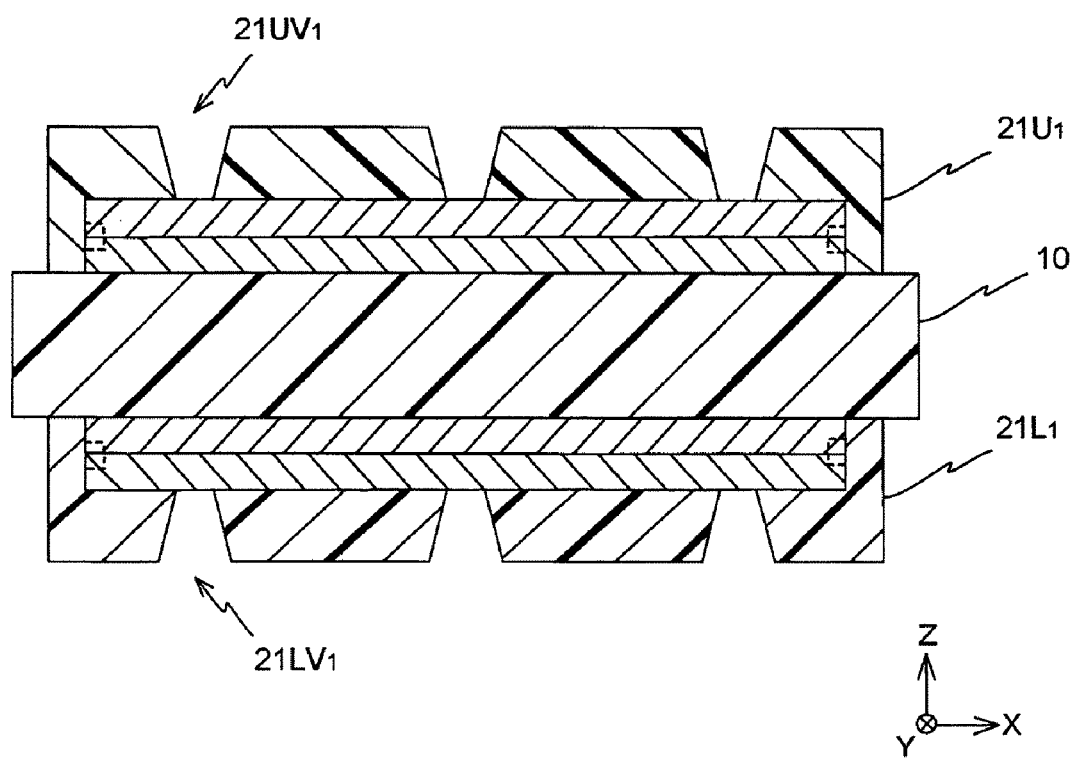
FIG. 3B is a process chart (No. 6) that shows a process for manufacturing a printed wiring board according to the first embodiment.

Next, as shown in FIG. 3B, a plurality of apertures 21UV1 and 21LV1 for an interlayer connection via conductor are formed. Lasers that can be used to form these apertures include a carbon dioxide gas laser, an excimer laser, a YAG laser, a UV laser, and others. When forming the aperture by laser, a protective film such as PET (polyethylene terephthalate) may be used.

Figure 3C:
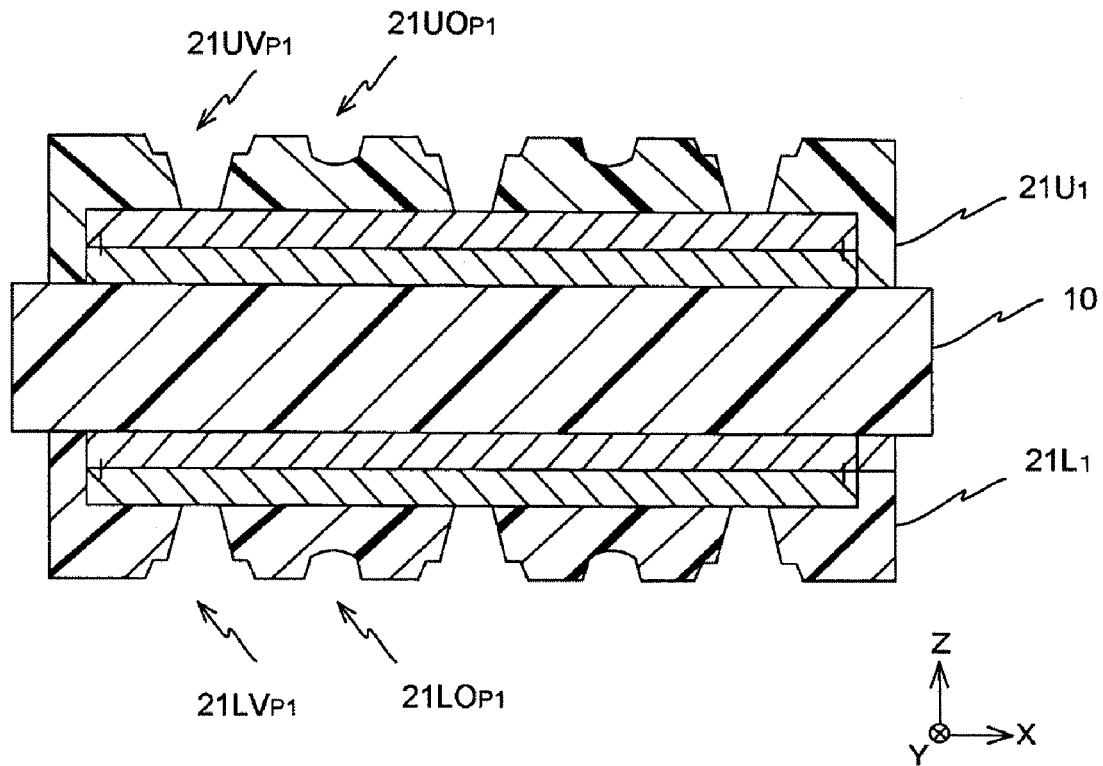
FIG. 3C is a process chart (No. 7) that shows a process for manufacturing a printed wiring board according to the first embodiment.

Subsequently, as shown in FIG. 3C, in the second laser process using a UV laser or an excimer laser, the first concave portions 21UOp1 and 21LOp1 for the conductor circuit are formed. In this case, the surface of the resin insulating layer that forms the first concave portion slants inwardly as it approaches the metallic foils 11U or 11L on which the pad is formed.

When performing this second laser process using a UV laser, it is preferable to simultaneously remove any residual resin on the bottom of the apertures 21UVp1 and 21LVp1 for the abovementioned via conductor. This improves the connection reliability between the subsequently formed via conductor and pad.

Figure 3D:
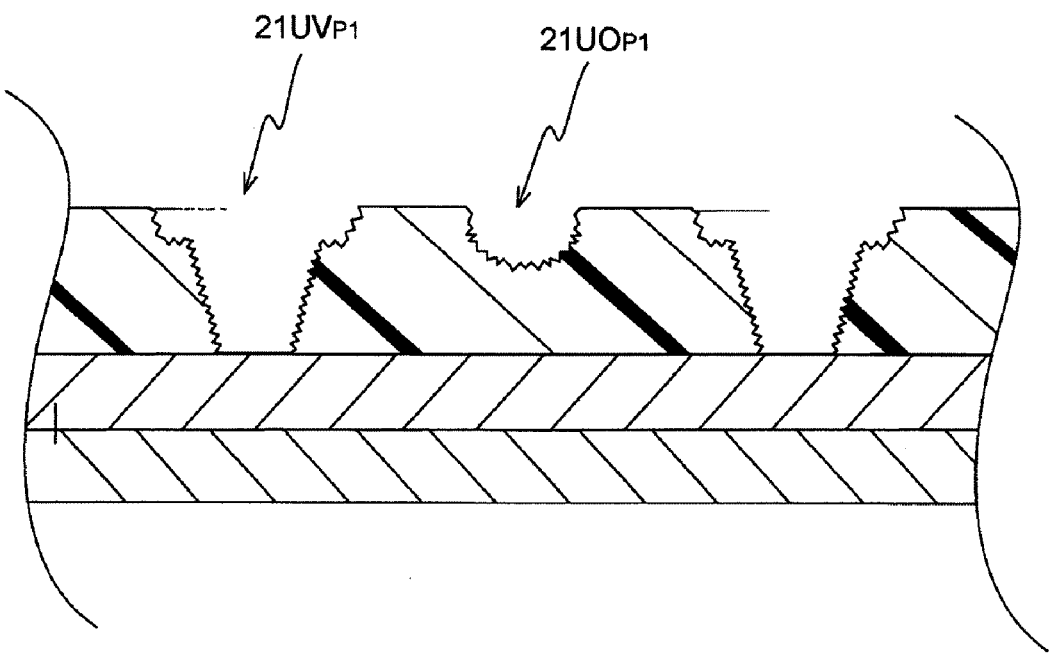
FIG. 3D is a process chart (No. 8) that shows a process for manufacturing a printed wiring board according to the first embodiment.

After forming concave portions 21UOp1 and 21LOp1 for the abovementioned conductor circuit, this member may be immersed in a permanganate solution to roughen the surface of the resin insulating layers 21U1 and 21L1 (see FIG. 3D).

Figure 3E:
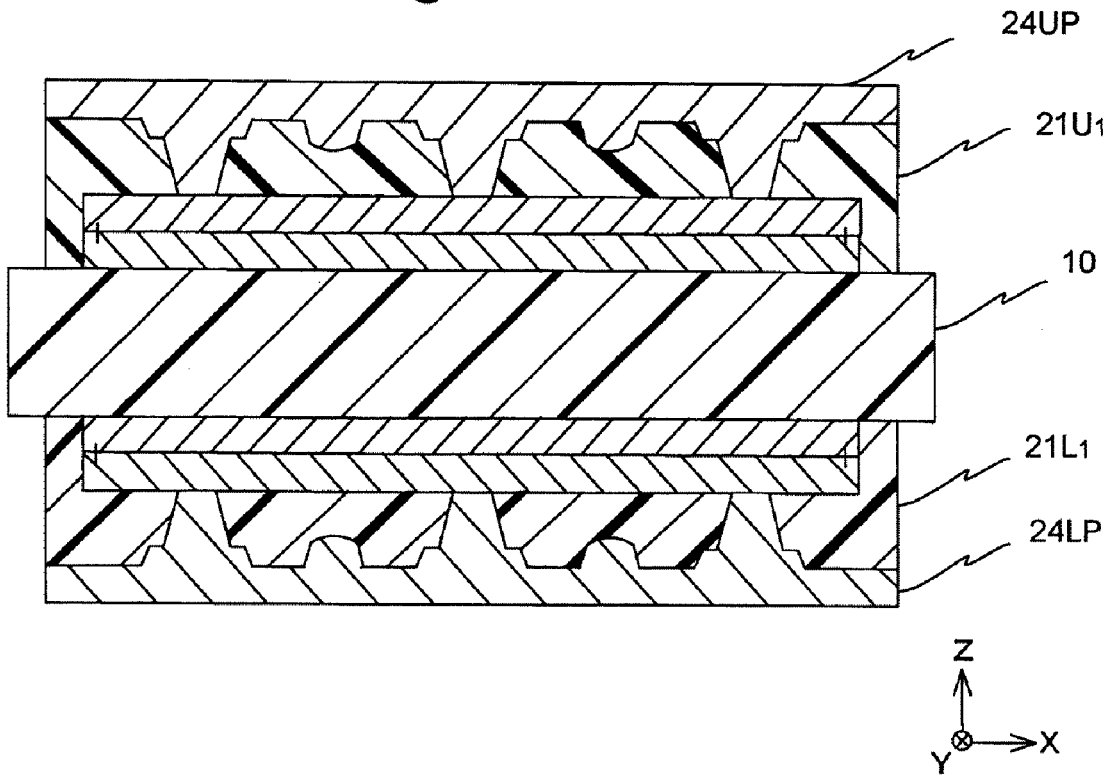
FIG. 3E is a process chart (No. 9) that shows a process for manufacturing a printed wiring board according to the first embodiment.

Next, as shown in FIG. 3E, in order to cover the surface of the resin insulating layers 21U1 and 21L1 that include the aperture for the via conductor and the first concave portion, plating layers 24UP and 24LP composed of an electroless plating film (an electroless copper plating film) and an electrolytic plating film (an electrolytic copper plating film) are formed thereon.

Figure 3F:
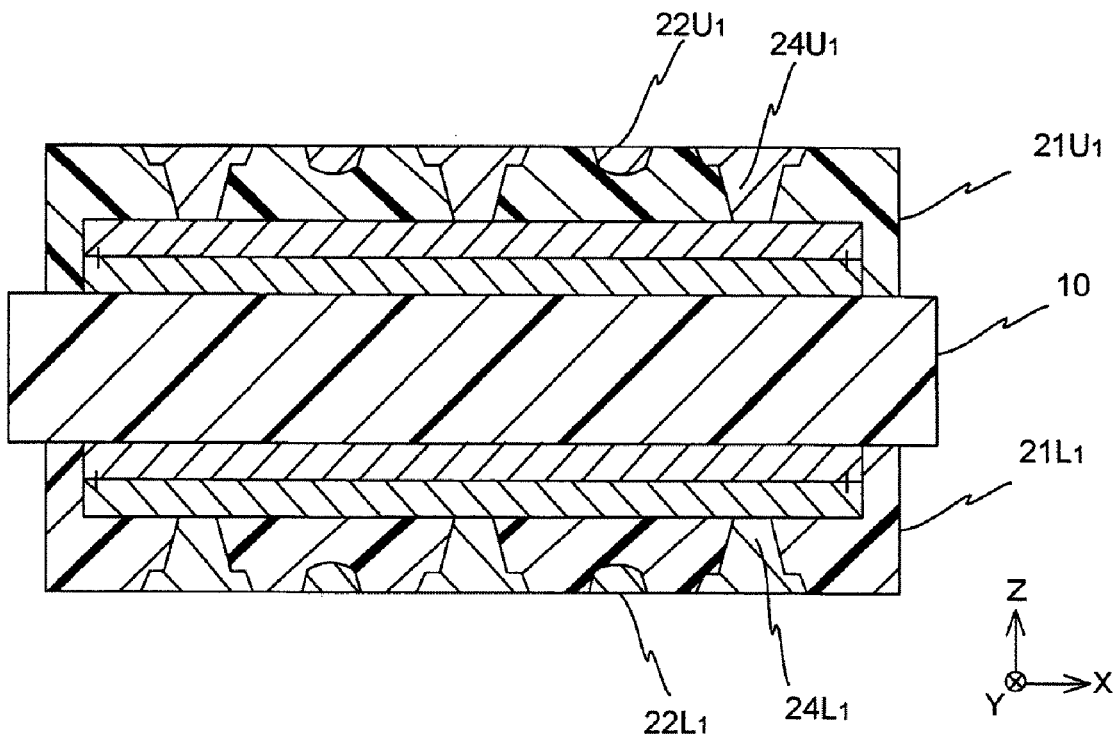
FIG. 3F is a process chart (No. 10) that shows a process for manufacturing a printed wiring board according to the first embodiment.

Next, the abovementioned plating layers 24UP and 24LP are polished until the surface of the resin insulating layers 21U1 and 21L1 are exposed to form the via conductor 24U1 embedded into the resin insulating layer and the inner layer conductor circuits 22U1 and 22L1 (see FIG. 3F). Examples of the abrasive method used here include Chemical Mechanical Polishing (CMP) or puff polishing. This leads to the formation of the inner layer conductor circuit and the via conductor that connects the inner layer conductor circuit to the metallic foil. In this case, the inner layer conductor circuits 22U1 and 22L1 have slanted sides that increase in width along the +Z direction.

Figure 3G:
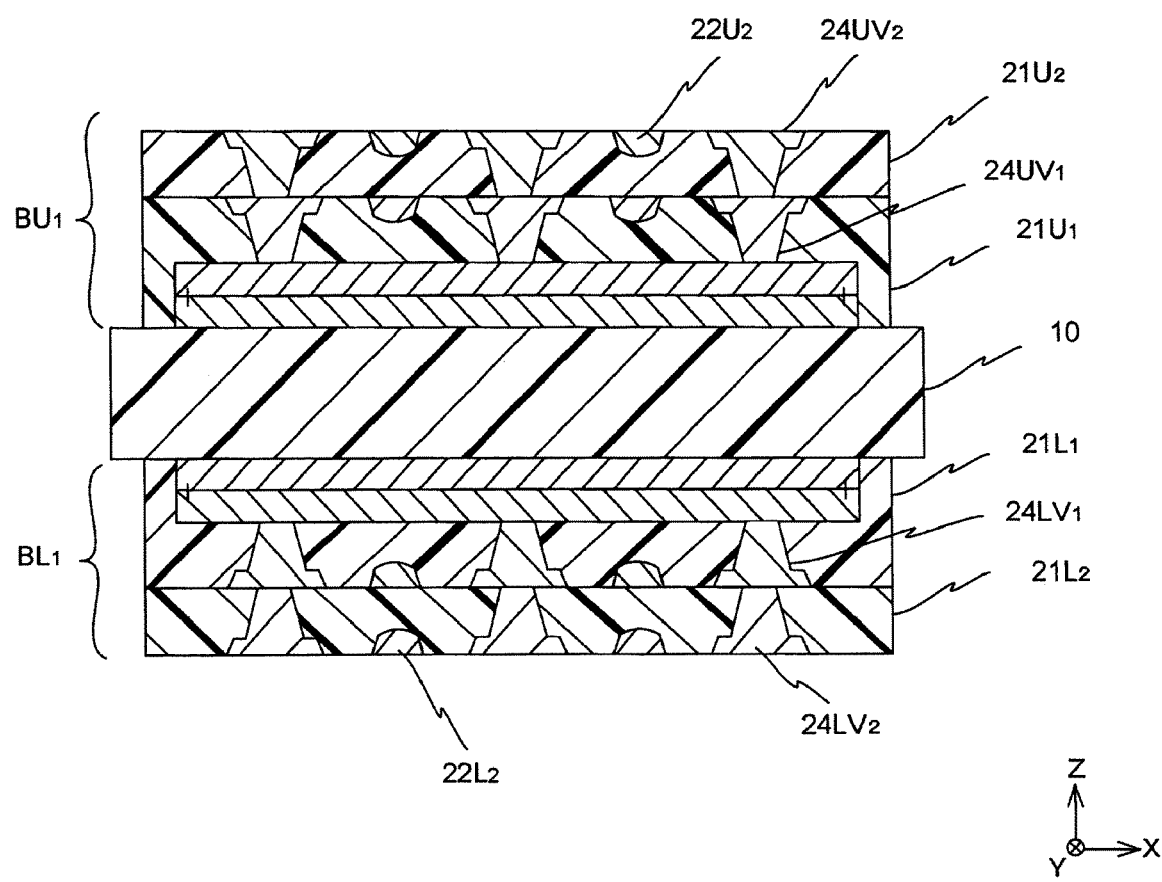
FIG. 3G is a process chart (No. 11) that shows a process for manufacturing a printed wiring board according to the first embodiment.

The process of forming the resin insulating layer 21Uj and 21Lj, the process of forming the interlayer connection via conductor 24Uj and the inner conductor layer 22Uj, and the process of forming the interlayer connection via conductor 24Lj and the inner conductor layer 22Lj are then repeated to build additional layers (see FIG. 3G).

Next, the resin insulating layers 21U3 and 21L3 are formed to cover the surface of the buildup part BU1 formed as mentioned above (see FIG. 4A). On these resin insulating layers 21U3 and 21L3, the apertures 21UO3 and 21LO3 for the interlayer connection via conductor are then formed (see FIG. 4B).

Figure 4A:
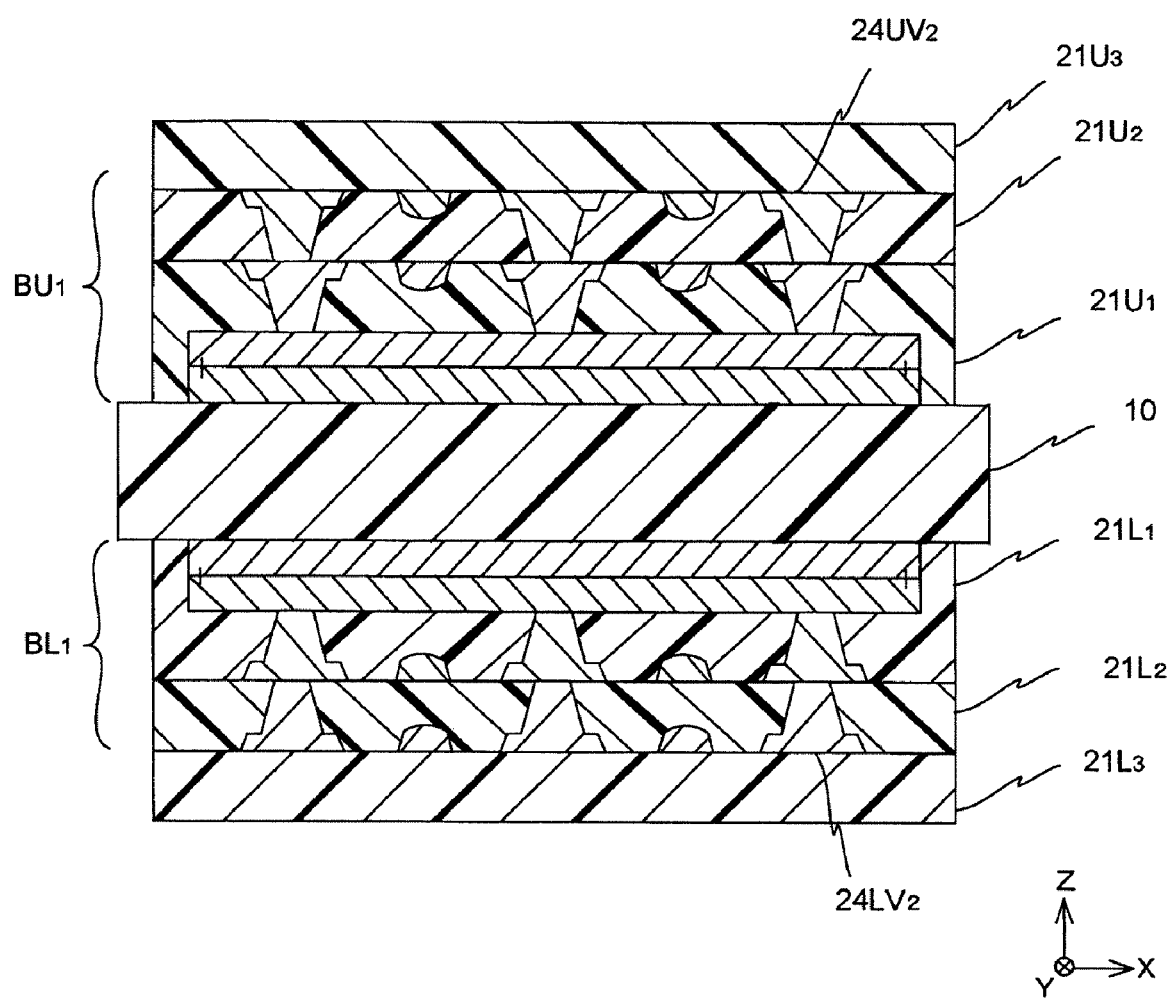
FIG. 4A is a process chart (No. 12) that shows a process for manufacturing a printed wiring board according to the first embodiment.
Figure 4B:
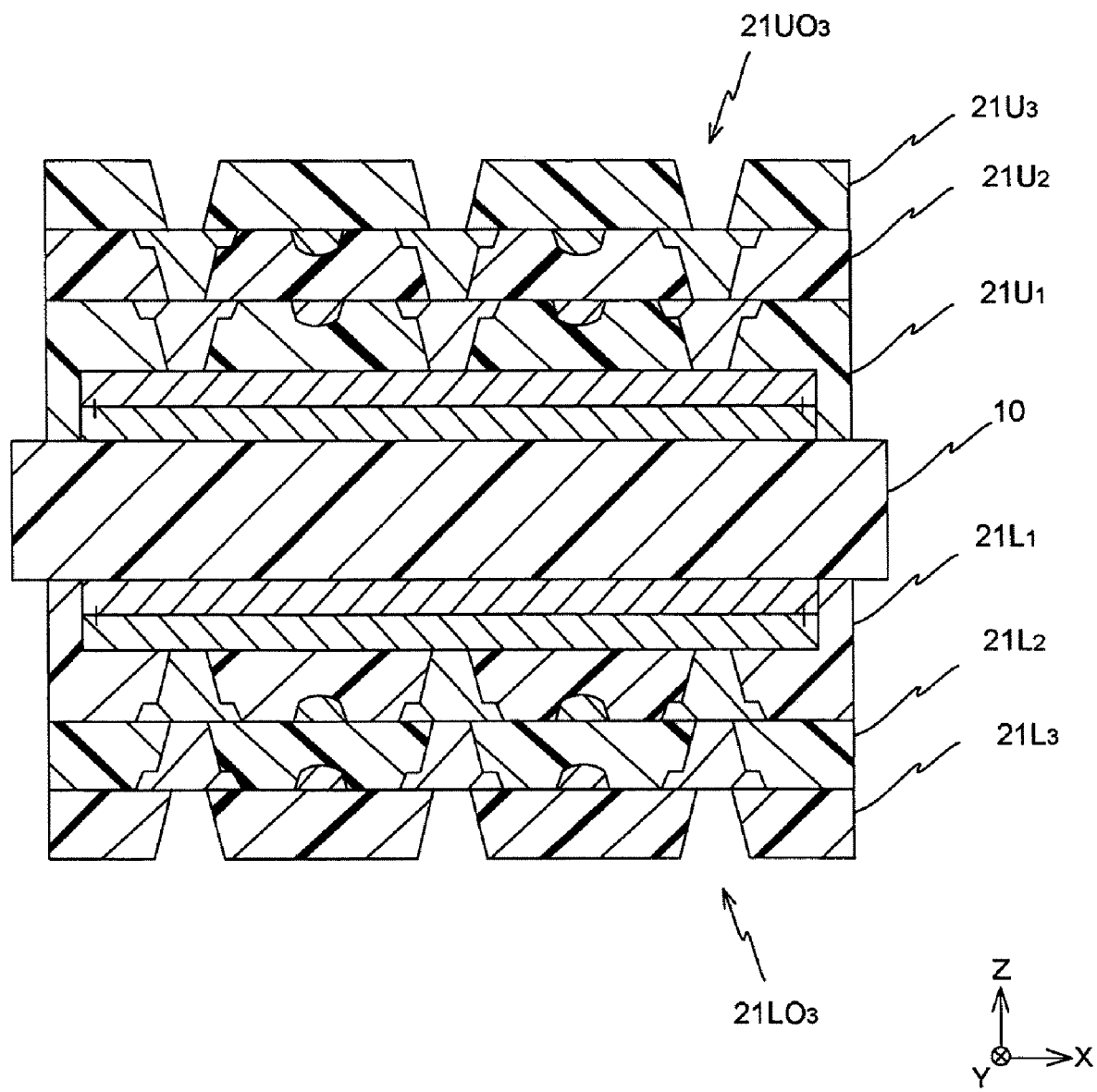
FIG. 4B is a process chart (No. 13) that shows a process for manufacturing a printed wiring board according to the first embodiment.

The apertures 21UO3 and 21LO3 for the via conductor can be formed by using any laser selected from a carbon dioxide gas laser, excimer laser, or YAG laser (see FIG. 4B).

In addition, when using photopolymers as the resin insulating layers 21U3 and 21L3, exposure/development may be performed to form the apertures 21UO3 and 21LO3 for the via conductor in a manner similar to those mentioned above.

Subsequently, a catalytic core is formed in the surface of the resin insulating layers 21U3 and 21L3, and the plating film 26UP and 26LP are formed through electroless plating (see FIG. 4C).

Figure 4C:
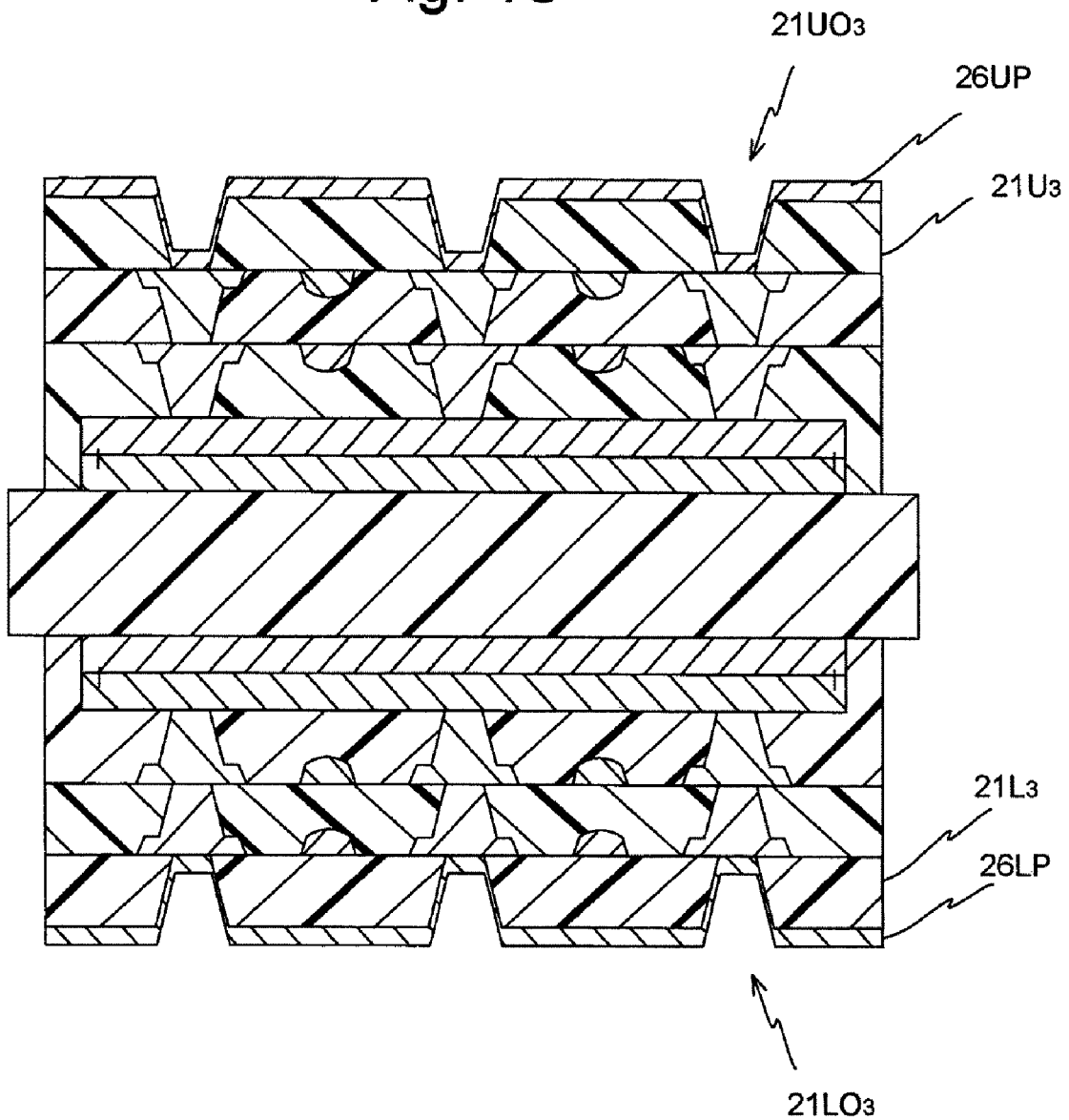
FIG. 4C is a process chart (No. 14) that shows a process for manufacturing a printed wiring board according to the first embodiment.
Figure 4C:
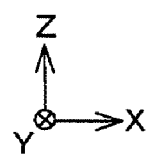
Figure 4D:
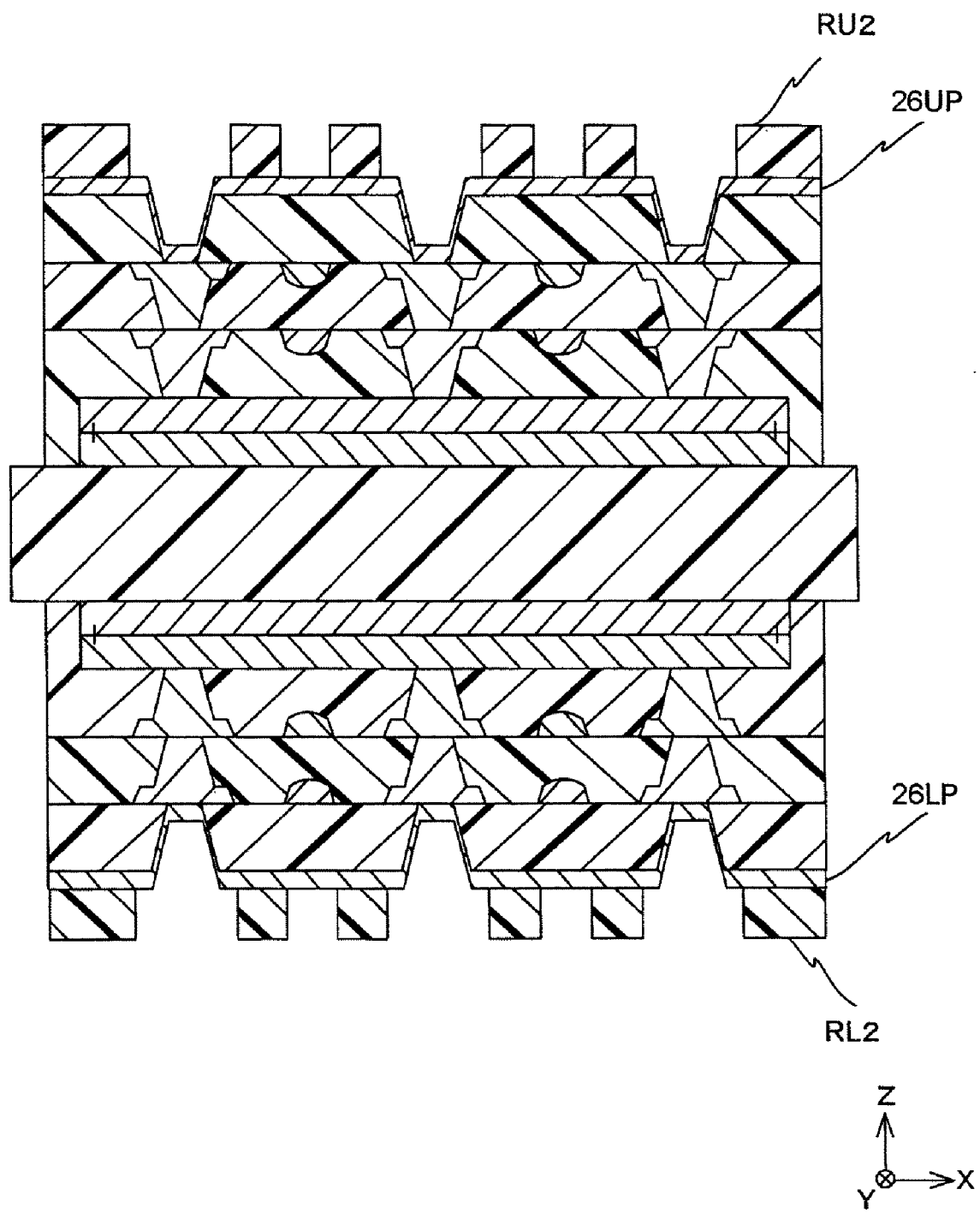
FIG. 4D is a process chart (No. 15) that shows a process for manufacturing a printed wiring board according to the first embodiment.

Next, on the electroless plating films 26UP and 26LP, resist patterns RU2 and RL2 are formed (see FIG. 4D). An electroless plating film is then formed on the part where the resist pattern is not formed, and the aperture for the via conductor is filled by electrolytic plating.

Figure 4E:
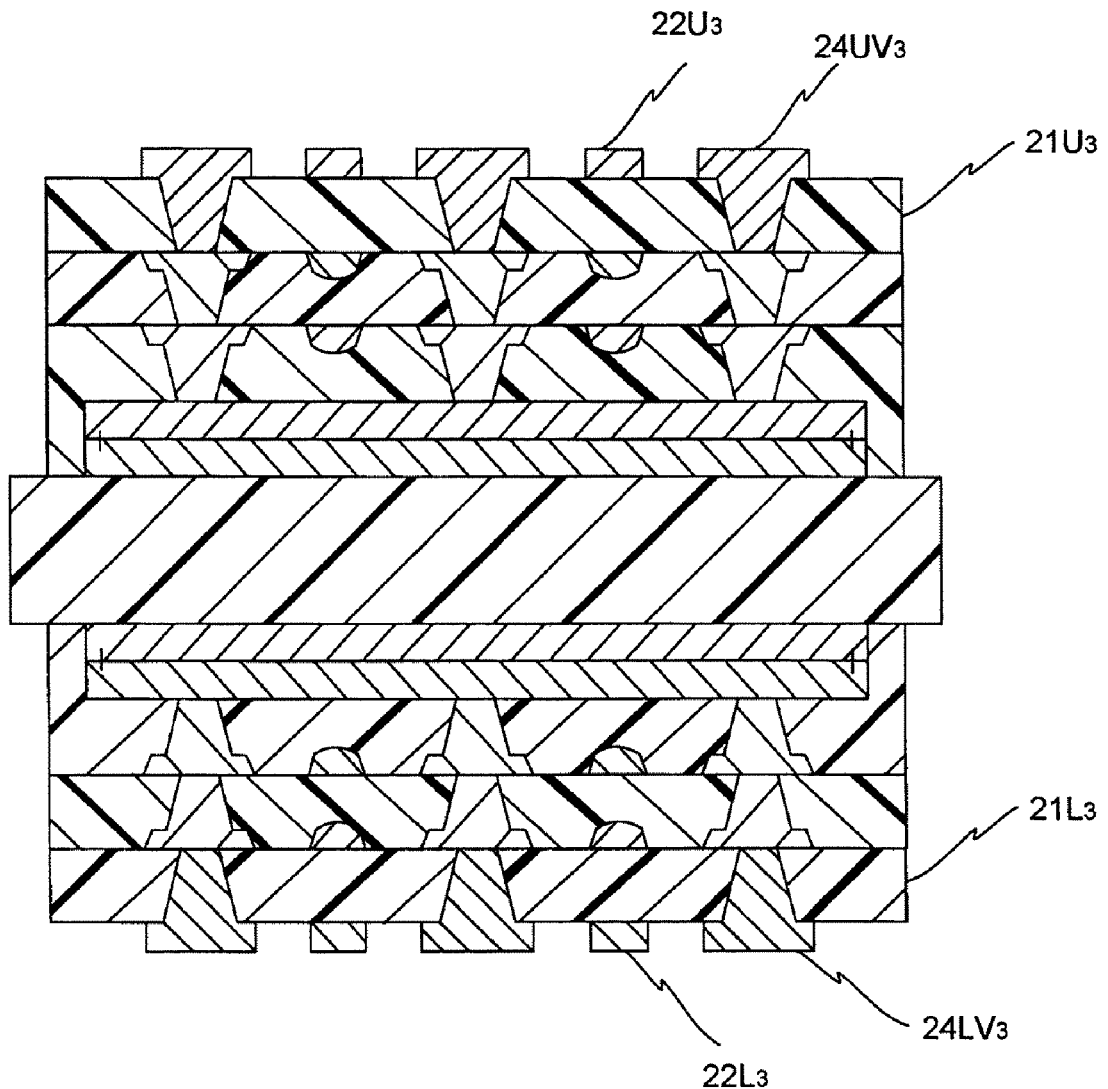
FIG. 4E is a process chart (No. 16) that shows a process for manufacturing a printed wiring board according to the first embodiment.
Figure 4E:
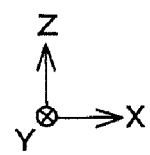

Next, the plating resist and the electroless plating film beneath the plating resist are removed to form the inner layer conductor circuit 22U3 in the first surface of the resin insulating layer 21U3 and the inner layer conductor circuit 22L3 in the first surface of the resin insulating layer 21L3 (see FIG. 4E). Herein, it is preferable that the surface of the resin insulating layers 21U3 and 21L3 and the surface of the inner layer conductor circuits 22U3 and 22L3 are all roughened.

The resin insulating layer 21U4 is formed to cover the inner conductor layer 22U3 and the via conductor 24UV3 formed in this manner, and the resin insulating layer 21L4 is formed to cover the inner conductor layer 22L3 and the via conductor 24LV3. Thereafter, the process of forming the abovementioned apertures for the via conductor 24UO4 and 24LO4 (not shown) by laser to the process of forming the inner conductor layers 22U4 and 22L4 are repeated as necessary to form the buildup parts through the abovementioned semi-additive method (see FIG. 4).

The solder resists 30U and 30L are then formed in the surfaces of the buildup parts BU2 and BL2, respectively. These solder resists 30U and 30L can be formed by, for example, the application of a commercially available solder resist composition followed by dry treatment.

Thereafter, exposure and development are performed by using a mask to expose part of the conductor circuit. The apertures 51UO and 51LO are formed in the solder resists 30U and 30L, respectively (see FIG. 5).

Herein, the conductor circuits 28U and 28L exposed by the apertures 51UO and 51LO and formed in the solder resist function as a pad. On the pad, solder members (solder bumps) and pins are formed. Then, through these solder members (solder bumps) and pins, this printed wiring board is electrically connected to the other substrate.

The apertures provided in the solder resist may be formed to expose part of the surface of the via conductor and the conductor circuit (via land) connected to the via conductor. Also, in this case, the conductor part exposed by the aperture of the solder resist functions as a pad.

The laminate body 40 manufactured as mentioned above is cut at predetermined points A1-A1' and A2-A2' inside the joint AD. As a result, the middle substrate 20U' having the metallic foil 11U and the laminate body 20U and the middle substrate 20L' having the metallic foil 11L and the laminate body 20L' are each separated from the support member BS (see FIG. 5).

Next, a resist pattern is formed on the metallic foils 11U and 11L provided in the surface of the laminate bodies 20U and 20L. Using etching liquid containing copper chloride or ferric chloride, the metallic foil 11U or 11L is removed from the sites where a resist pattern is not formed.

As a result, the pad 42L, on which electronic parts may attach, is formed. In the surface of this pad 42L, the protective film 44L is formed. The protective film 44L may be formed with one layer or with multiple layers.

When the protective film 44L is composed of one layer, for example, an electroless Au plating film or an electroless Pd plating film is formed on the pad to create a protective film. When the protective film 44L is composed of two layers, for example, an electroless Ni plating film and an electroless Au plating film are formed on the pad to create a protective film. When the protective film 44L is composed of three layers, each plating film is formed in the order of electroless Ni plating film, electroless palladium plating film, and electroless Au plating film to create a protective film. In similar, a protective film is formed for the pad 28L (see FIG. 6).

Figure 6:
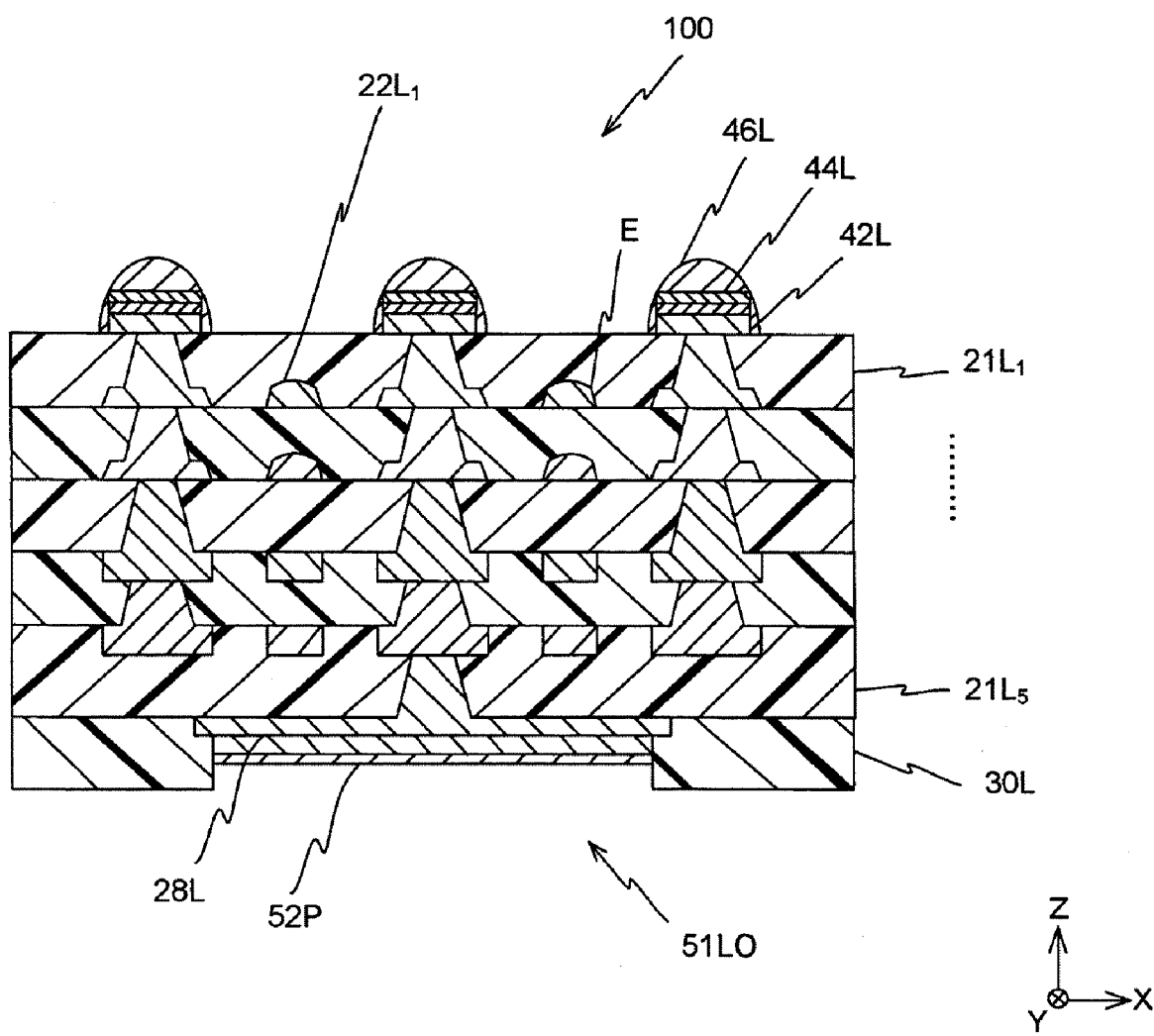
FIG. 6 is a process chart (No. 19) that shows a process for manufacturing a printed wiring board according to the first embodiment.

Thereafter, as shown in FIG. 6, a solder member (solder bump) 46U is formed by printing solder paste and reflowing.

As described above, by slanting the sides of the conductor circuit embedded into the outermost resin insulating layer, when viewing the cross section of the conductor circuit, the angle of the edge part E appears blunt (obtuse angle). Therefore, for example, even when inner stress occurs on the outermost resin insulating layer as mentioned above in response to heat generation by the semiconductor device, stress concentrated on the edges of the conductor circuit is relieved compared to cases with conventional angles. As a result, it is possible to effectively prevent cracks from forming on the resin insulating layer from the edges of the conductor circuit.

Stress can be further relieved by making the upper side of the conductor (i.e. the +Z side) arc-shaped.

In addition, the surface of the conductor circuit 22Lj and the resin insulating layer 21Lj are aligned to approximately the same plane, which ensures the flatness of the buildup part.

In the abovementioned first embodiment, a wiring is formed by being embedded into the resin insulating layer on the upper layer side (+Z direction side) of the buildup part, wherein it is necessary for the wiring to be finely pulled around in accordance with the shortened intervals between the terminals of the electronic parts. On the lower side (−Z direction side) of the buildup part, where less fine pulling is required compared to these wirings, a wiring is formed using a semi-additive method.

The roughening process after forming a concave portion on the resin insulating layer may be omitted. When omitting this roughening process, on the resin insulating layer including the concave portion for the conductor circuit, for example, by using any of the metals selected from Ti, W, Ta, or Cu, a thin film is formed by spattering, and this thin film is then used as a feeding layer to perform electrolytic plating. Next, it is polished to expose the surface of the resin insulating layer. As a result, a conductor circuit is formed while ensuring excellent adhesion between the conductor circuit and the resin insulating layer.

In addition, in the abovementioned first embodiment, among the laminate parts, the conductor layer having an embedded wiring is considered to be two layers. However, the number of layers is not specifically limited. That is, all of the conductor layers that constitute the laminate part may be configured by an embedded wiring. In this case, wiring is not formed through a semi-additive method.

Furthermore, in the first surface of the resin insulating layer 21U3 and the second surface of 21L3, within the same layer as the conductor circuit 22U3 or 22L3, at least one of either the power source plane layer or the grand plane layer may be formed. In this case, a microstrip structure is formed including these plane layers and the conductor circuit 22Lj located thereon.

Herein, because the resin insulating layers 21U3 and 21L3 are each formed on a schematic plane configured by the conductor circuits 22L2, 22U2 and the resin insulating layers 21L2, 21U2, it is possible to obtain a flat, even thickness. As a result, characteristic impedance can be effectively matched, thus facilitating the stabilization of signal propagation.

Using a support member in which a conductor layer is formed on one side, according to the abovementioned procedure, a buildup part is formed on one side of the support member to manufacture a multilayer printed wiring board.

Embodiment 2

Figure 7A:
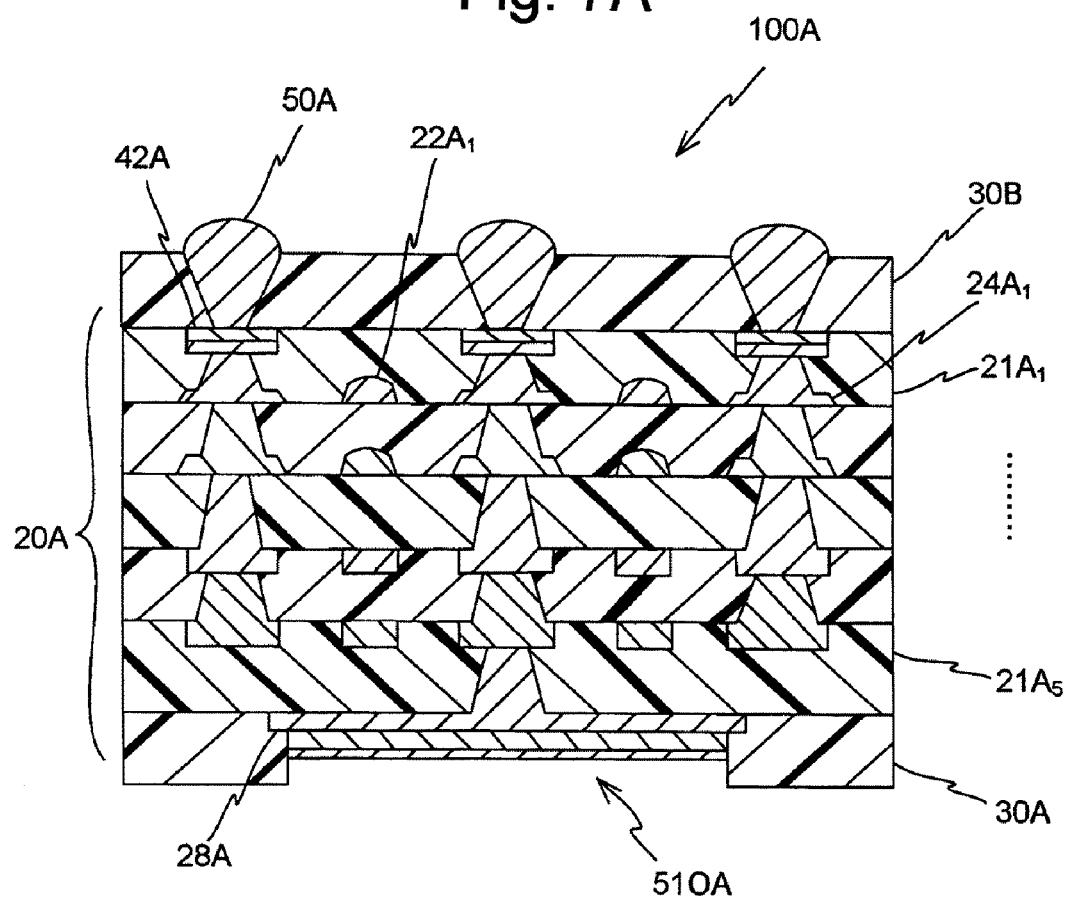
FIG. 7A is a cross-sectional view that shows the composition of a printed wiring board according to a second embodiment of the present invention.
Figure 7A:
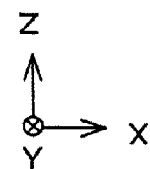
Figure 7B:
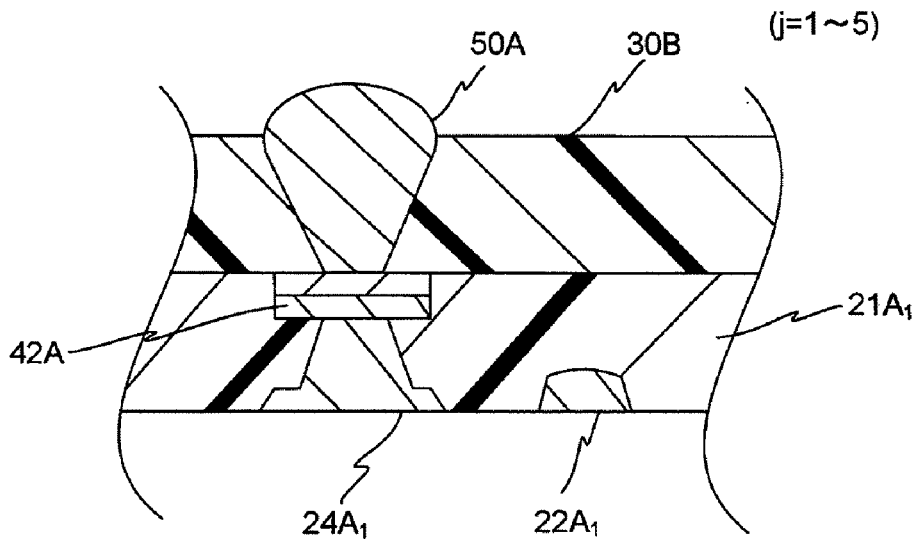
FIG. 7B is a diagram that magnifies a part of the cross-sectional view of a printed wiring board according to the second embodiment.

In FIG. 7, the printed wiring board 100A comprises: (a') a laminated part 20A formed with multiple insulating layers 21Aj (j=1-5); (b') an electronic parts loading pad 42A; (c') a solder resist 30A formed on the −Z direction side of the laminate part 20A, and (d') a solder resist 30B formed on the +Z direction side of the laminate part 20A. The solder resists 30A and 30B may be omitted.

Herein, the configuration of the laminate part 20A is identical to that of the abovementioned laminate part 20U and comprises: (i) a resin insulating layer 21Aj as an alternative to the abovementioned resin insulating layer 21Lj, (ii) a conductor layer having the conductor circuit 22A as an alternative to 22Lj, and (iii) a via conductor 24Aj for an interlayer connection between conductor circuits as an alternative to 24Lj.

In addition, the abovementioned pad 42A is provided in the second concave portion created in the second surface (+Z direction surface) of the outermost resin insulating layer 21A1 of the laminate part 20A. On this pad 42A, a protective film is formed. The surface of this protective film is located on approximately the same plane as the second surface of the resin insulating layer 21A1 (see FIG. 7B).

In the second embodiment, as an insulating member 10A, for example, a metallic plate such as a copper plate is used. On this insulating member 10A, a seed layer 11A composed of multiple metals is formed. For example, in the first surface (+Z direction surface) of the copper plate, a chrome layer is first formed. In the first surface of this chrome layer, a copper layer is formed to be a seed layer 11A. For the formation of the abovementioned seed layer, methods such as electroless plating, sputtering, or evaporation can be used.

As an alternative to chrome, it is possible to use other metals that are treated by an etching solution for etching metals that constitute the insulating member 10A at significantly slow etching speeds.

Figure 8A:
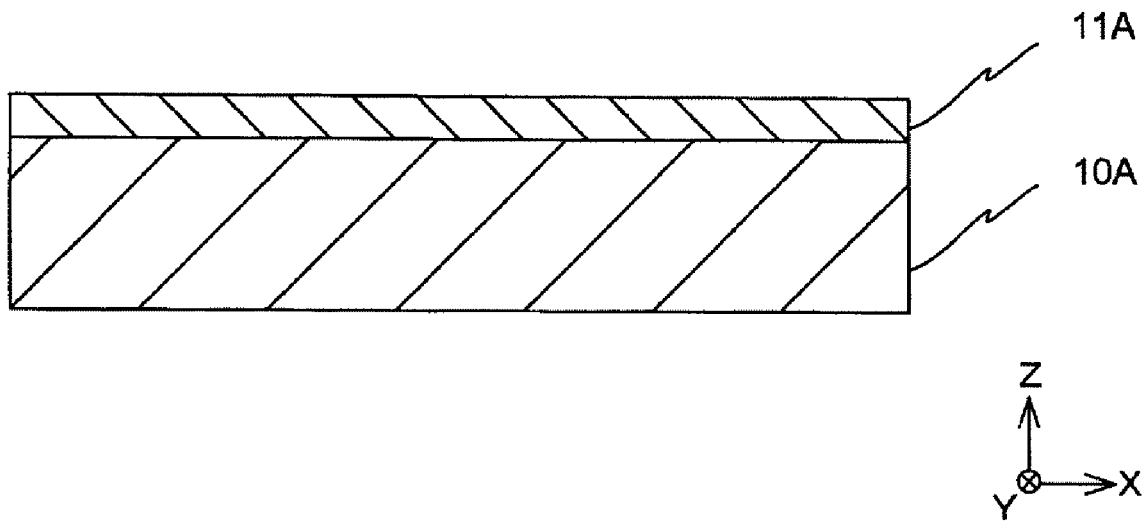
FIG. 8A is a process chart (No. 1) that shows a process for manufacturing a printed wiring board according to the second embodiment.
Figure 8B:
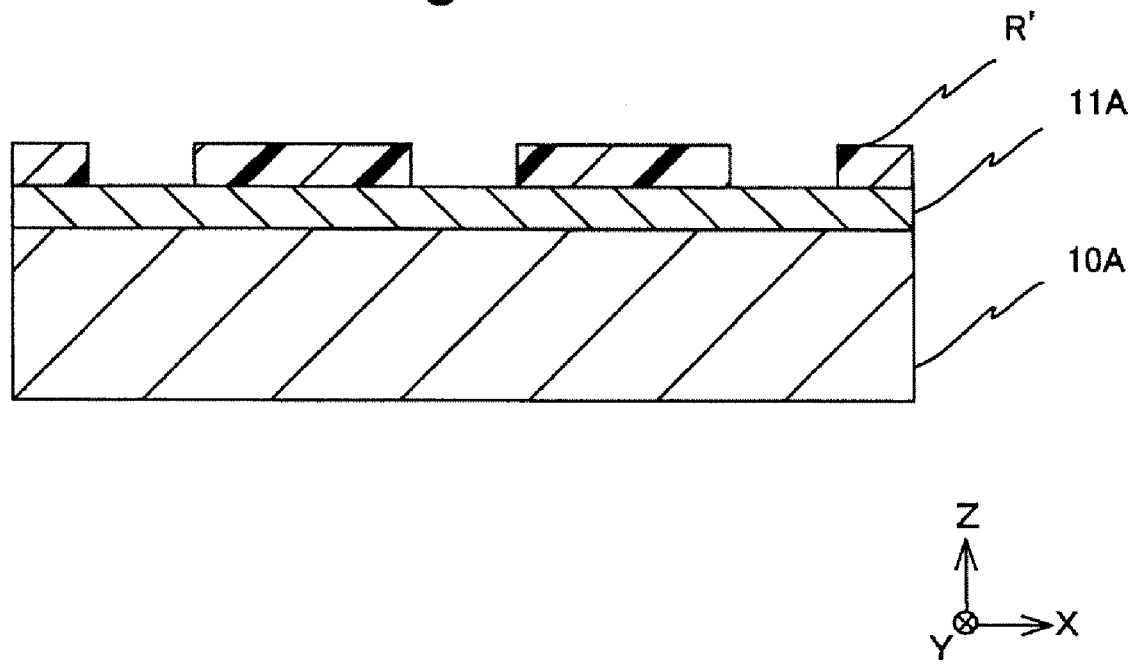
FIG. 8B is a process chart (No. 2) that shows a process for manufacturing a printed wiring board according to the second embodiment.

Next, after forming the seed layer 11A, a resist pattern R' is formed in the first surface of the seed layer 11A (see FIG. 8B). In the surface of the seed layer 11A exposed from the resist pattern R', a metallic layer P1 is then formed (see FIG. 8C). This metallic layer P1 can be formed to have a gold (Au) plating film, a palladium (Pd) plating film, and a nickel (Ni) plating film toward the +Z direction from the surface of the seed layer 11A. For example, these plating films are formed by electrolytic plating.

In addition, as a metallic layer P1, an Au—Ni complex layer may be formed. This metallic layer P1 functions as a protective film to prevent oxidization of the pad (described below) for parts implementation and has the effect of improving solder wettability.

Figure 8C:
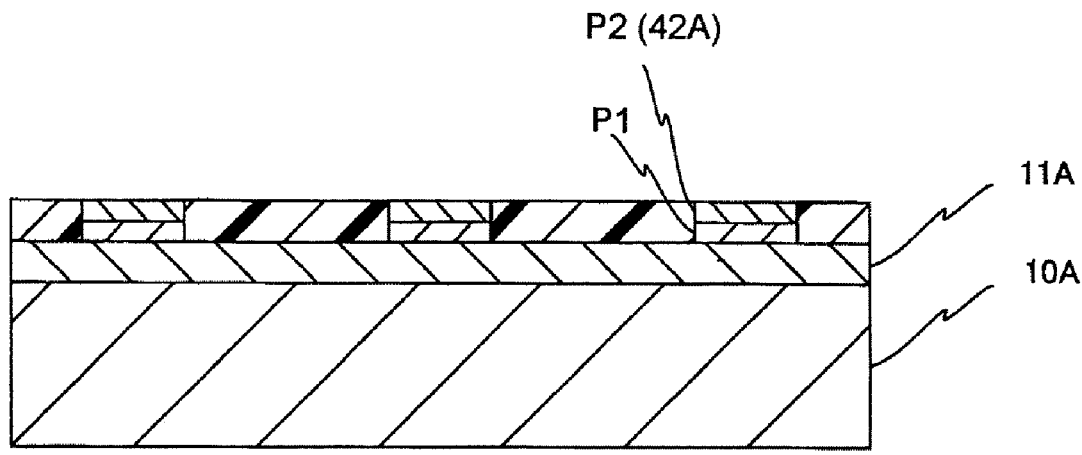
FIG. 8C is a process chart (No. 3) that shows a process for manufacturing a printed wiring board according to the second embodiment.
Figure 8C:
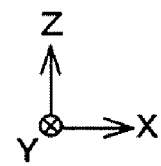
Figure 8D:
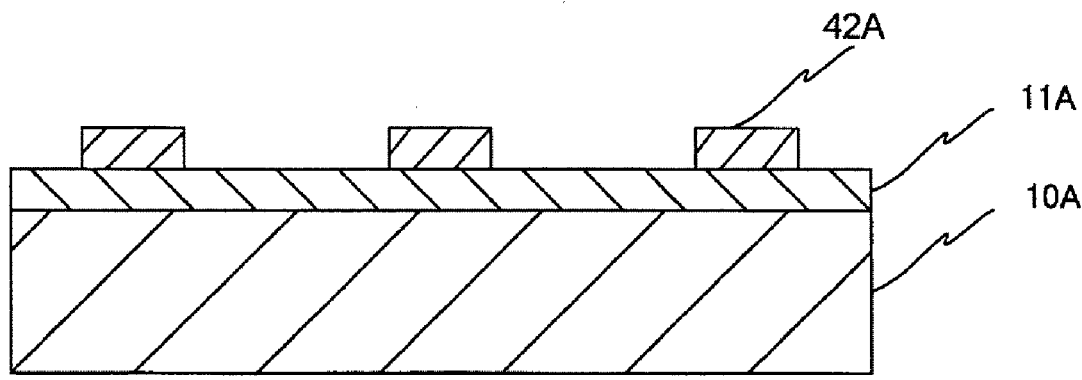
FIG. 8D is a process chart (No. 4) that shows a process for manufacturing a printed wiring board according to the second embodiment.
Figure 8D:
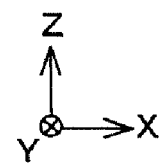
Figure 8E:
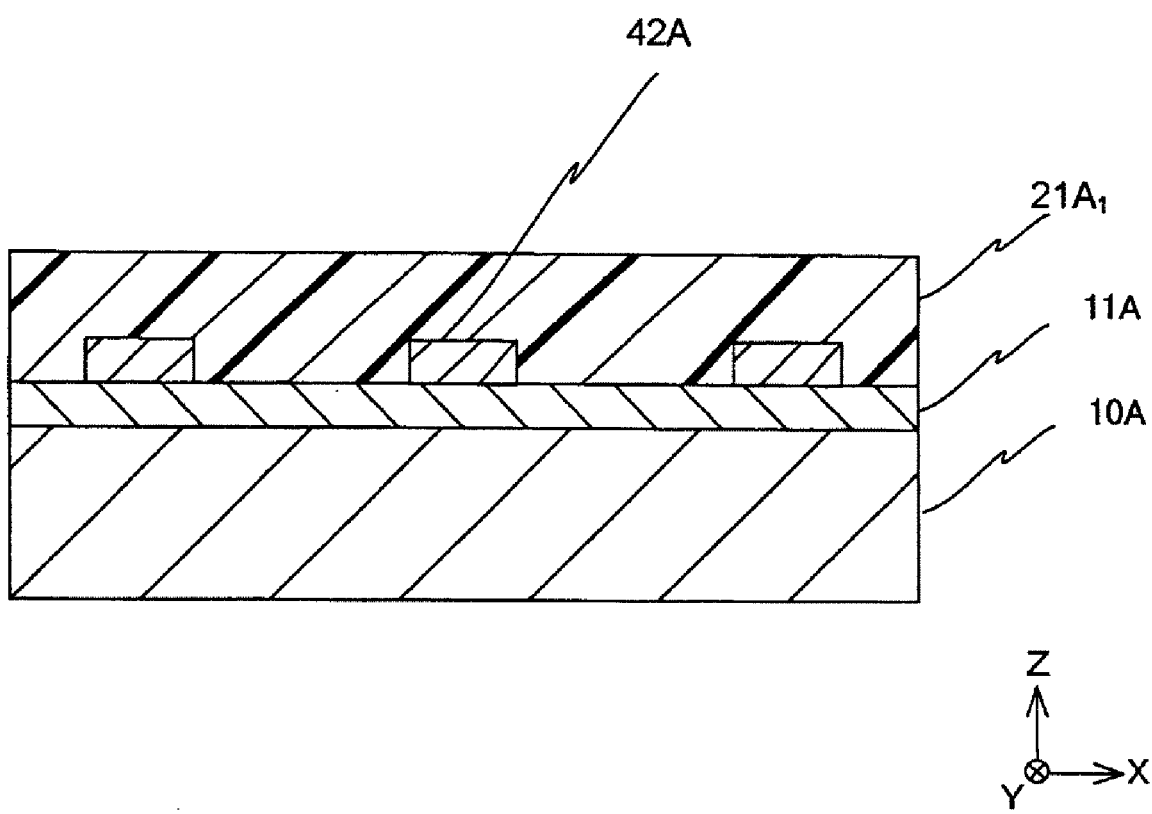
FIG. 8E is a process chart (No. 5) that shows a process for manufacturing a printed wiring board according to the second embodiment.

Next, on this metallic layer P1, for example, a metallic layer P2 composed of copper is formed by, for example, electrolytic plating (see FIG. 8C). This metallic layer P2 functions as a pad 42A for loading electronic parts. Subsequently, the resist is removed according to a known method, (see FIG. 8D). In a similar manner as in the first embodiment, the resin insulating layer 21A1 is then formed (see FIG. 8E). For this formation of the resin insulating layer 21A1, the abovementioned resin can be used.

Figure 9A:
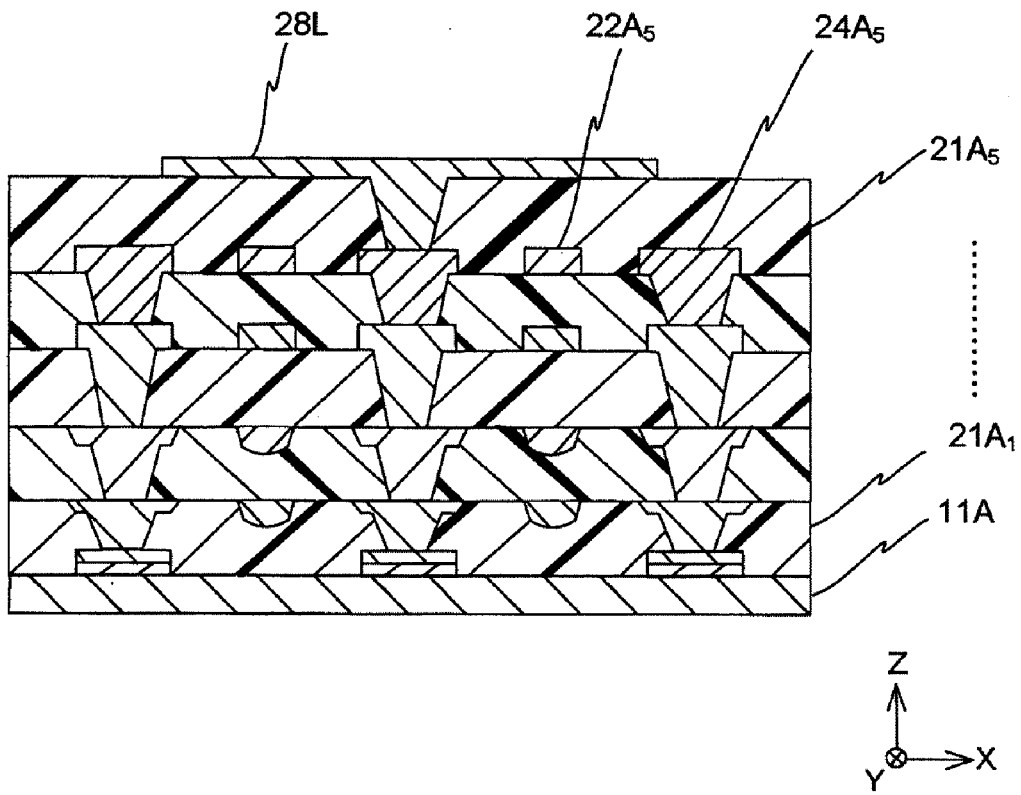
FIG. 9A is a process chart (No. 6) that shows a process for manufacturing a printed wiring board according to the second embodiment.
Figure 9B:
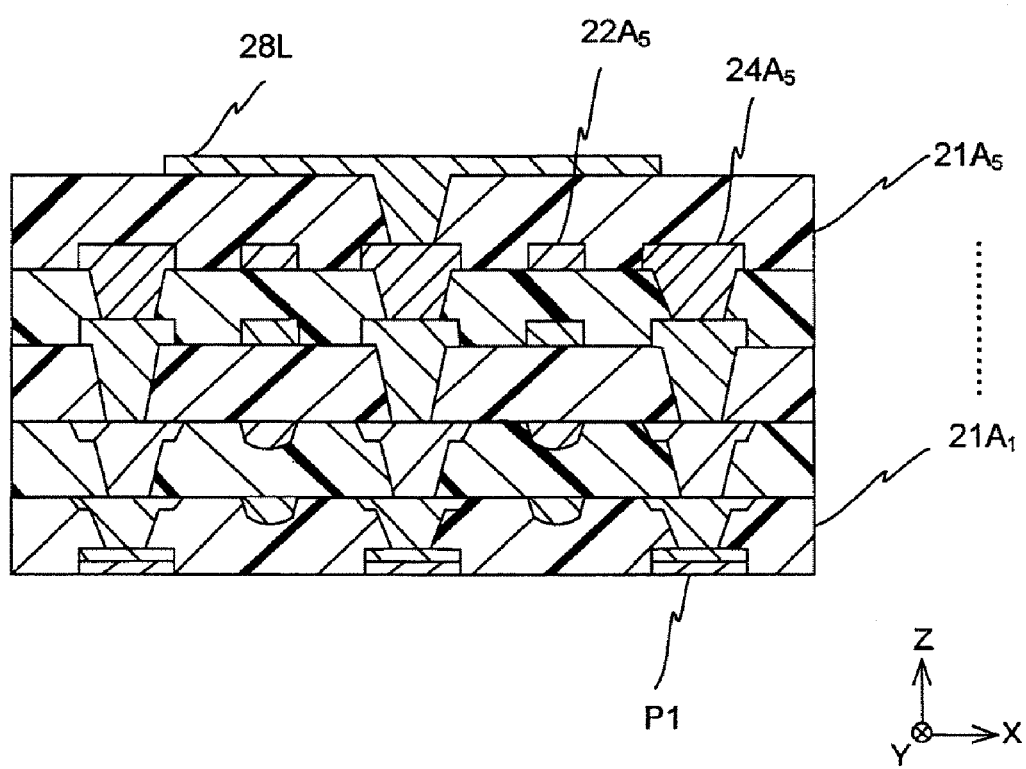
FIG. 9B is a process chart (No. 7) that shows a process for manufacturing a printed wiring board according to the second embodiment.
Figure 9C:
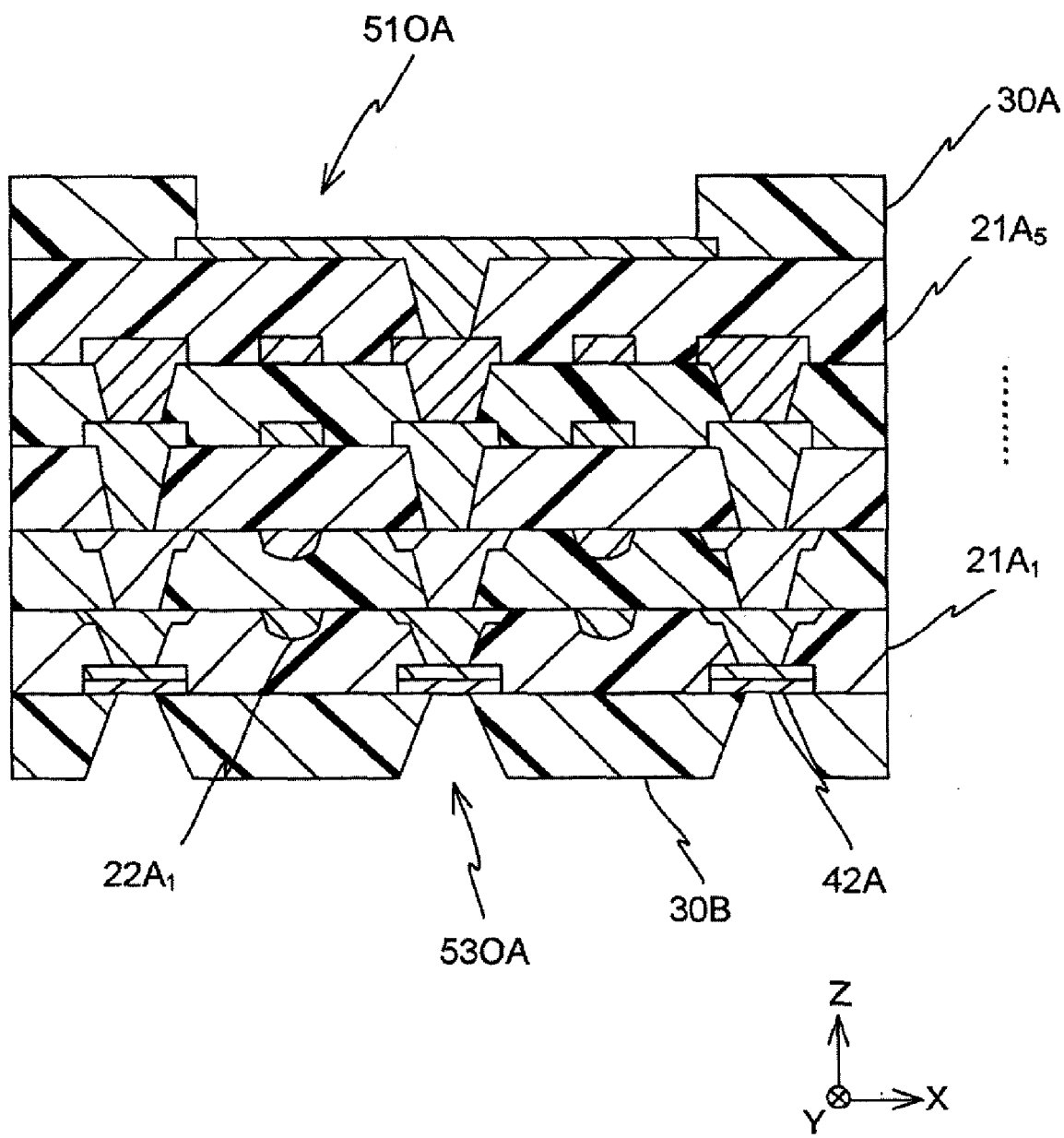
FIG. 9C is a process chart (No. 8) that shows a process for manufacturing a printed wiring board according to the second embodiment.
Figure 9D:
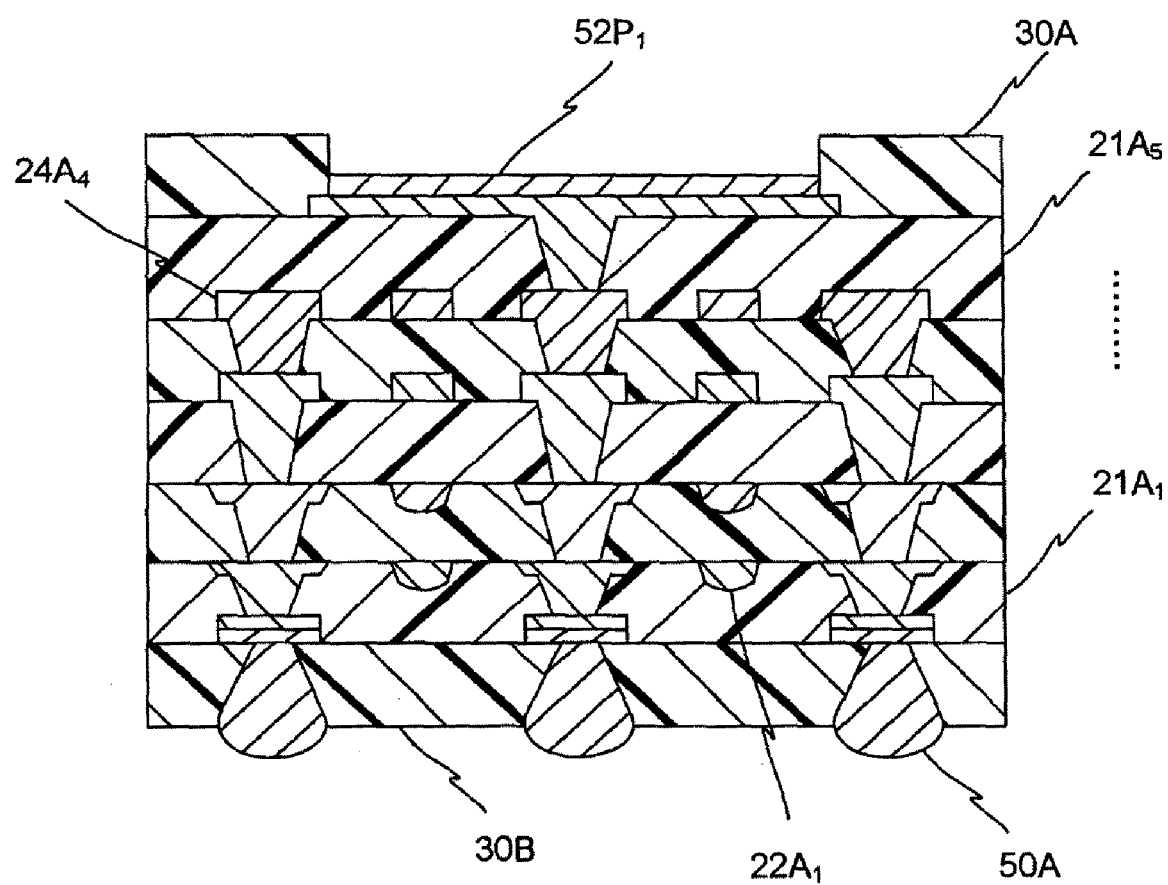
FIG. 9D is a process chart (No. 9) that shows a process for manufacturing a printed wiring board according to the second embodiment.

Next, according to the procedures shown in FIG. 3B-4F as mentioned above, a buildup layer is formed, and the insulating member 10A is then removed by etching and others (see FIG. 9A). In this case, the etching of the copper that constitutes the insulating member 10A stops at the chrome layer that constitutes the seed layer 11A.

Next, the abovementioned removal of the seed layer 11A is performed (see FIG. 9A). For example, when a seed layer 11A is formed on the +Z direction surface of the insulating layer in the order of the chrome layer and the copper layer, the seed layer 11A is first removed in the order of the chrome layer and the copper layer. In this case, the chrome layer is removed by using an etching solution for etching the chrome layer rather than the copper layer, and the copper layer is then removed by using an etching solution for etching the copper layer that constitutes the seed layer. As a result, the protective film P1 formed on the parts implementation pad 42A is exposed to the first surface (−Z direction surface) of the resin insulating layer 21A1 (see FIG. 9B). In this case, the first surface of the resin insulating layer 21A1 and the surface of the protective film P1 are located on approximately the same plane.

After removing the seed layer 11A, the solder resist 30A is formed on the resin insulating layer 21A5 (+Z direction surface) and the solder resist 30B is formed on the resin insulating layer 21A1 where the abovementioned pad 42A is formed (−Z direction surface). Inside the solder resist 30B, an aperture 530A is formed to expose part of the parts implementation pad 42A (see FIG. 9C).

Figure 10:
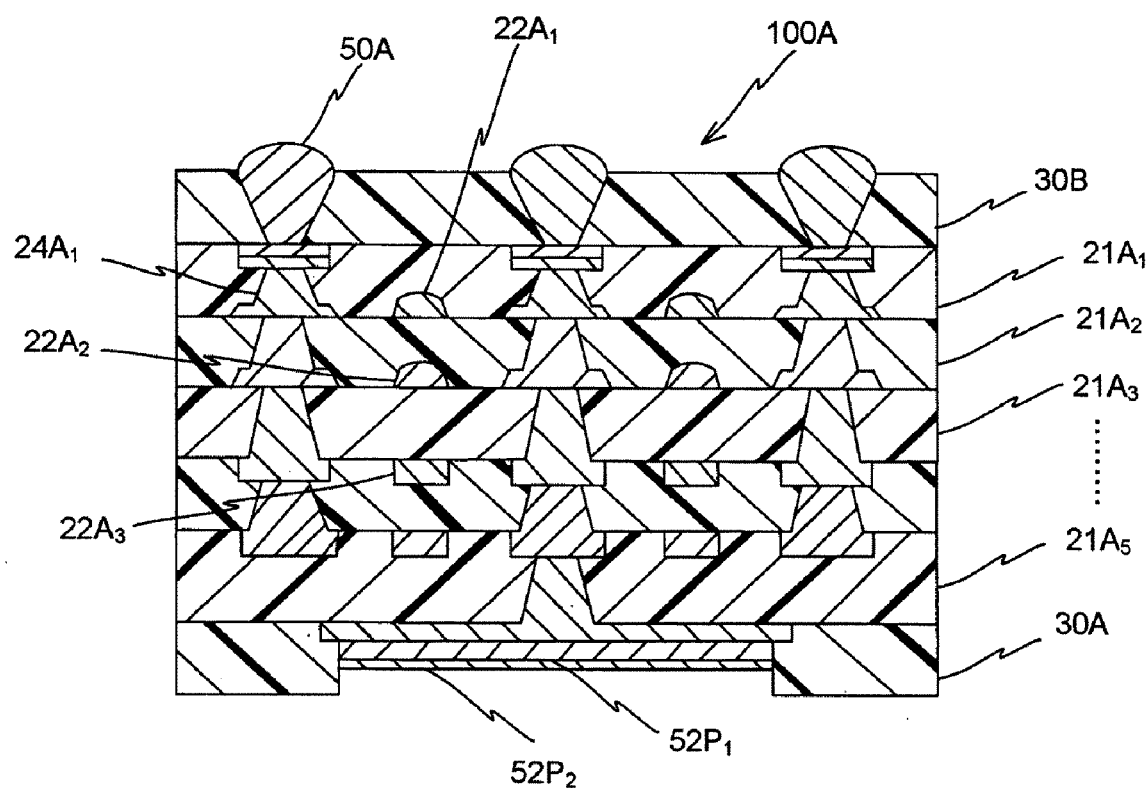
FIG. 10 is a process chart (No. 10) that shows a process for manufacturing a printed wiring board according to the second embodiment.
Figure 10:
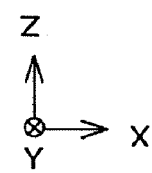

Subsequently, on the parts implementation pad 42A, a solder member (solder bump) 50A is formed (see FIG. 9D) to manufacture the printed wiring board 100A (see FIG. 10).

According to the multilayer wiring board 100A of the abovementioned second embodiment, it is possible to obtain similar effects to the first embodiment and the following additional effects.

In short, for the multilayer print wiring board 100A of the second embodiment, the pad 42A is formed inside the outermost resin insulating layer 21A1. Furthermore, in the surface of the pad 42A, a protective film is formed. The surface composed of this protective film and the outermost resin insulating layer 21A1 form a schematic plane. Therefore, when the solder resist 30B is not formed, the fillability of the underfill resin can be improved. In addition, because the surface composed of the protective film and the outermost resin insulating layer 21A1 form a schematic plane, it facilitates the matching of the height of the solder member, which improves the efficiency of implementing the electronic parts.

In the abovementioned second embodiment, among the laminate parts, the conductor layer having an embedded wiring is considered to be two layers. However, the number of layers is not specifically limited. That is, all of the conductor layers that constitute the laminate part may be configured by an embedded wiring. In this case, wiring is not formed using a semi-additive method.

In the first surface of the resin insulating layer 21A3, within the same layer as the conductor circuit 22A3, at least one of either the power source plane layer or the grand plane layer may be formed. In this case, by including these plane layers and the conductor circuit 22A2 located thereon, a microstrip structure is formed.

Herein, the resin insulating layer 21A3 is formed on the schematic plane composed of the conductor circuit 22A2 and the resin insulating layer 21A2, thus achieving flatness and even thickness. As a result, characteristic impedance can be effectively matched, which facilitates the stabilization of signal propagation.

Further description of the second exemplary embodiment of the present invention is given by way of the examples below

EXAMPLE 1

Manufacture of the Printed Wiring Board (1) Support Member BS

As a support member SM, double-sided copper clad laminate BS (item number: MCL-E679 FGR by Hitachi Chemical Co., Ltd.) is used, wherein copper foils FU and FL with a thickness of 18 μm are applied on both sides of a glass epoxy plate with a thickness of 0.4 mm (see FIG. 2A).

Next, as shown in FIG. 2A, on both sides of the double-sided copper clad laminate SM, the first surface of the 18-μm-thick copper foils 11U and 11L are laminated on the copper clad laminate. One surface of the copper foils 11U and 11L is a mat surface (surface with concaves and convexes), and the second surface is to be a mat surface.

Next, a horn of an ultrasound coupling device is set so that the copper foil and the double-sided copper clad laminate are joined in the position 20 mm inside from each terminal to couple the copper clad laminate and the copper foil under the following conditions (see FIG. 2B). The ultrasound device is configured so that the horn has an amplitude of 12 μm, a frequency of 28 kHz/sec, a pressure of approx. 0-12 kgf, and a feed rate of approx. 10 mm/sec.

The fixed part is located in a position 20 mm inside from the edge of the metallic foil toward the center, and the fixed width of both is set to be 2 mm.

Next, an etching resist using a commercially available resist is formed on the copper foil. Thereafter, by performing exposure and development, as shown in FIG. 2C, the etching resist is patterned to overlap with the joint part (AD).

Next, a tenting process is performed by using an etching solution containing copper chloride to remove the copper foils FU, 11U and F1, 11L. According to the ordinal method, the etching resist is then separated to manufacture the support member BS.

(2) Formation of the Laminate Body (2-1) Formation of the Embedded Wiring

To both sides of the base material BS manufactured as described above, an interlayer film for a buildup wiring (ABF series made by Ajinomoto Fine-Techno Co., Inc.) is attached and thermally hardened at approximately 170° C. for 180 minutes to form the resin insulating layer (the uppermost resin insulating layer) (see FIG. 3A).

Next, using the carbon dioxide gas laser, under the conditions of a wavelength of 10.4 μm, a beam diameter of 4.0 mm, single mode, a pulse width of 8.0μ seconds, and 1-3 shots, an aperture for the via conductor is formed (see FIG. 3B).

Next, using an excimer laser, under the conditions of a wavelength of 308 nm or 355 nm, a concave portion for the conductor circuit is formed (see FIG. 3C).

Electroless copper plating is performed using a commercially available plating bath to form an electroless copper plating film with a thickness of approximately 0.3-1 μm. Next, electrolytic plating is performed using this electroless copper plating film as a feed layer to form an electrolytic copper plating film with a thickness of 10-30 μm in the surface of the resin insulating layer (see FIG. 3E).

Then, the plating films of the resin insulating layer (electroless copper plating film and electrolytic copper plating film) are polished by puff polishing to expose and flatten the surface of the resin insulating layer (see FIG. 3F). In this case, a buffing count of #400, 600, or 800 is used. As a result, the via conductor 24U1 and the inner layer conductor circuit 22U1 are formed. In this non-limiting example, the width of the inner layer conductor circuit 22U1 is 5 μm, and an interval between parallel inner layer conductors 22U1 is also 5 μm. However, one skilled in the art will realize that other conductor widths and intervals are possible without departing from the scope of the present invention. Further a ratio of the conductor width to the interval between conductors is known as the line:space ratio.

The procedure is then repeated once more from the attachment of the interlayer film for buildup wiring to the formation of the via conductor and the inner layer conductor circuit (see FIG. 3G).

(2-2) Formation of the Wiring Using a Semi-Additive Method

Next, an interlayer film for buildup wiring (ABF series, Ajinomoto Fine-Techno Co., Inc.) is attached thereon and thermally hardened at approximately 170° C. for 180 minutes to form the resin insulating layer 21U3 (see FIG. 4A).

Then, using the carbon dioxide gas laser, under the conditions of a wavelength of 10.4 μm, a beam diameter of 4.0 mm, single mode, a pulse width of 8.0μ seconds, and 1 shot, an aperture for the via conductor is formed (see FIG. 4B).

Next, performing electroless copper plating with a commercially available plating bath, electroless copper plating film with a thickness of approximately 0.3-1 μm is formed (see FIG. 4C). Thereafter, a commercially available dry film for use as a plating resist is laminated, and as shown in FIG. 4D, the dry film is patterned using a photographic method. Electrolytic plating is then performed using the electroless plating film formed on the resin insulating layer as an electrode to form an electrolytic copper plating film with a thickness of 5-20 μm on the electroless copper film of the part where the plating resist is not formed. The plating resist is then removed.

Next, the electroless copper plating film placed beneath the plating resist is removed to form the inner layer conductor circuit 22U3 and the via conductor 24UV3 (see FIG. 4E). The via conductor formed herein fills the aperture formed on the resin insulating layer 21U3 so that the top surface is located on approximately the same plane as the top surface (+Z direction surface) of the inner layer conductor circuit 22U3 formed on the same resin insulating layer 21U3.

Figure 4F:
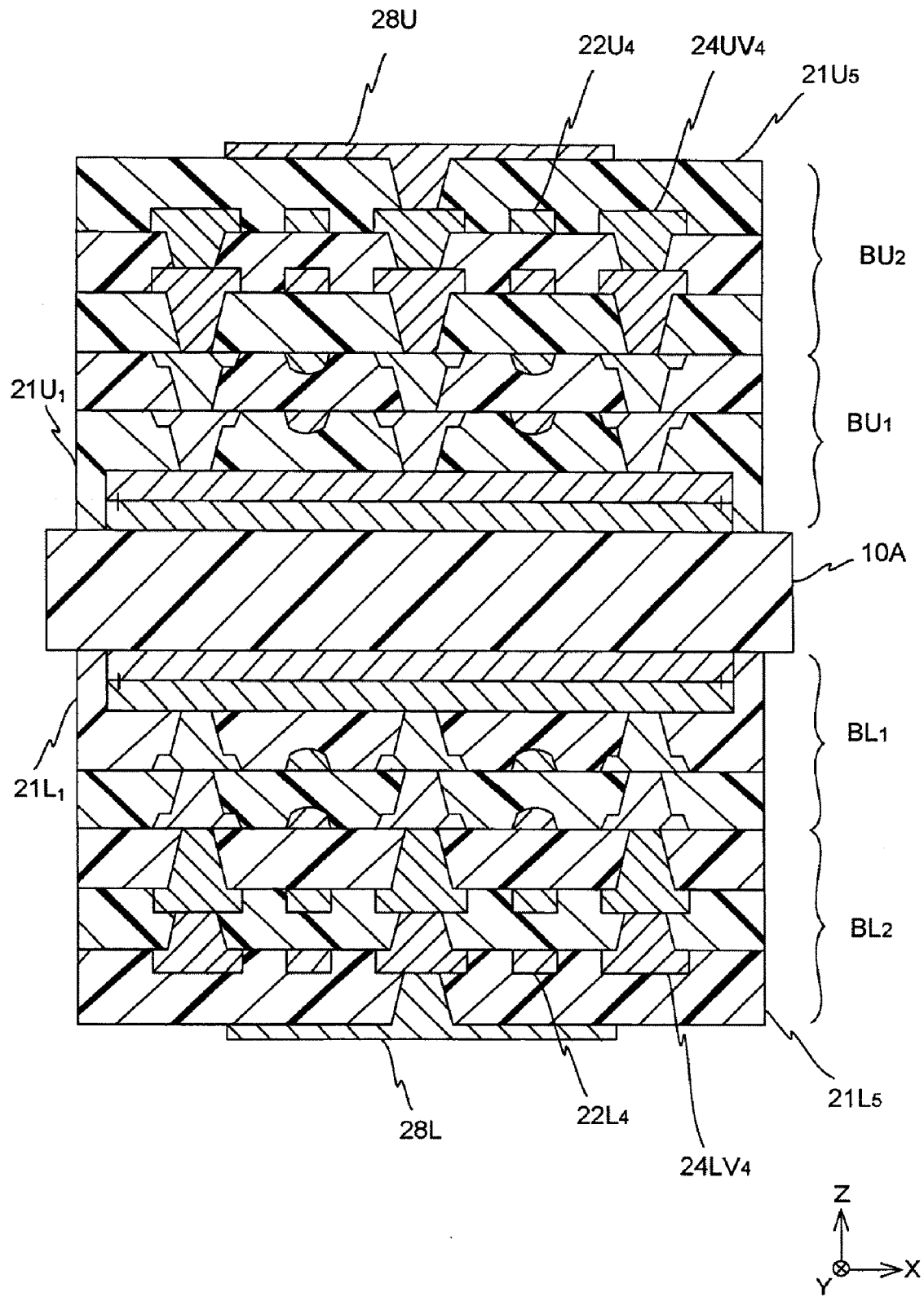
FIG. 4F is a process chart (No. 17) that shows a process for manufacturing a printed wiring board according to the first embodiment.
Figure 5:
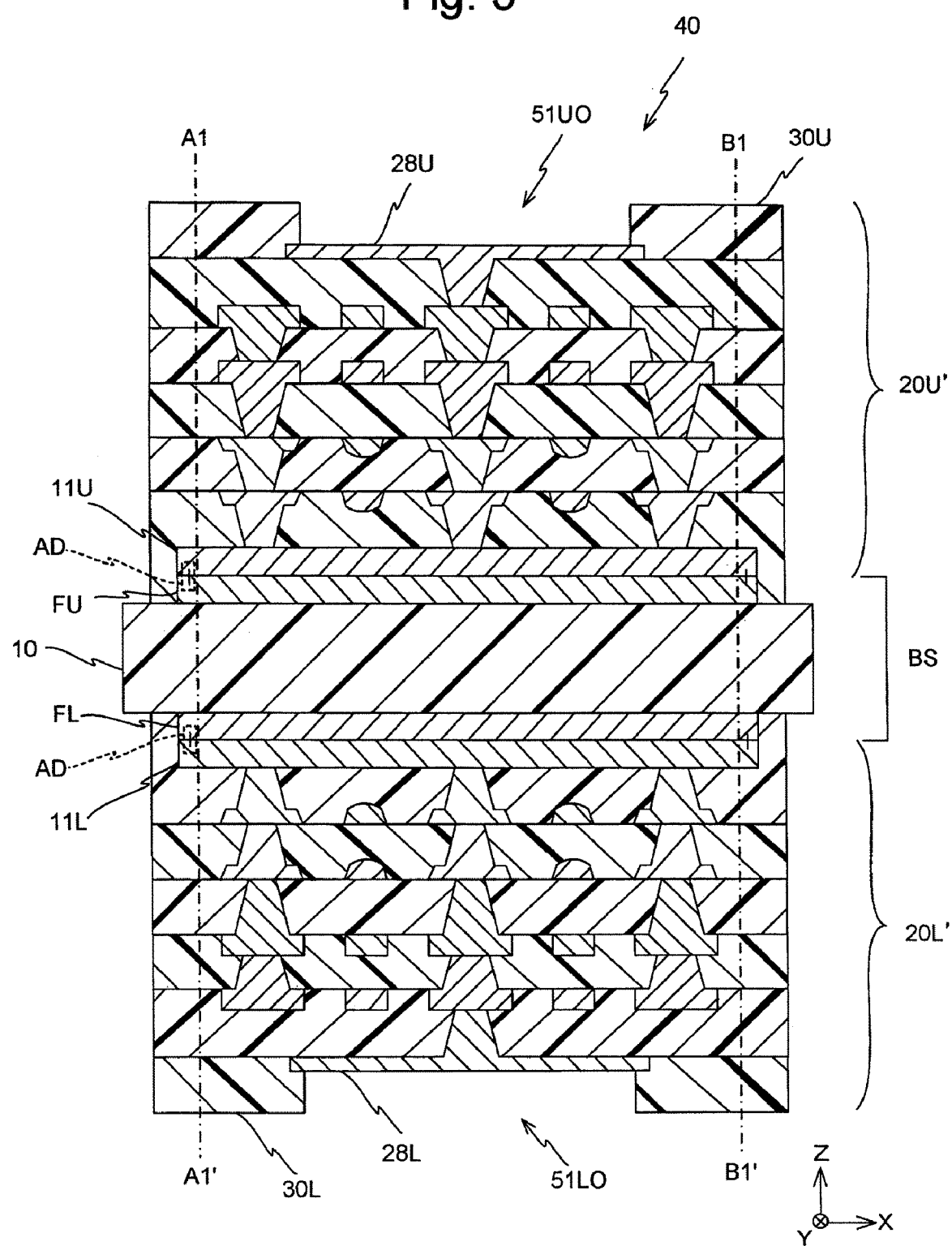
FIG. 5 is a process chart (No. 18) that shows a process for manufacturing a printed wiring board according to the first embodiment.

The process is then repeated twice from the formation of the resin insulating layer to the formation of the conductor circuit and the via conductor in order to form the laminate body BU2 (see FIG. 4F).

The solder resist 30U is formed on the conductor circuit 28U formed on the uppermost resin insulating layer 21U5 using a commercially available product. Next, a mask is laminated on those solder resists 30U to form an aperture in the solder resist 30U through photolithography. The surface part of the conductor circuit exposed by this aperture functions as a pad (see FIG. 5).

Next, the laminate member is cut inside the joint part to separate the support member BS from the laminate member 20U'. On the copper foil 11U on the separated laminate body, a commercially available dry film for use as an etching resist is laminated, and then an etching resist is patterned using a photographic method.

Using these conditions, etching is performed by using an etching solution that contains copper chloride as a main component to remove the copper foil from the part where the etching resist is not formed and form the pad 42L.

Next, in the surface of the pad 42L, the electroless Ni plating film and electrolytic Au plating film are formed to form the protective film 44L. On the pad 42L where the protective film is formed, a solder bump 46L is formed.

In this first example, the side of the outermost layer of the conductor circuit is slanted, and the edges have a moderately obtuse angle. Therefore, even when the semiconductor device mounted on the printed wiring board via the solder bump generates heat and causes inner stress occurring on the outermost resin insulating layer to concentrate on the edges of the conductor circuit, the inner stress is relieved by the moderate edges. As a result, with the edges of the conductor circuit as a base point, cracks can be effectively prevented from forming in the resin insulating layer.

EXAMPLE 2

Herein, the printed wiring board 100A according to the second embodiment (see FIG. 10) is manufactured.

In short, the pad 42A is formed firstly on the insulating member 10A (see FIG. 8A-8D), and then a buildup part and a solder resist are formed on the support member in a manner similar to the first embodiment.

EXAMPLE 3

The printed wiring board 100A is manufactured in a manner similar to the first example except that the first concave portion for the conductor circuit and the aperture for the via conductor are formed by imprinting.

As is readily apparent to one skilled in the art, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
   a first insulating layer having a first surface and a second surface on an opposite side of the first surface, the first insulating layer having a concave portion formed in the first surface and an aperture extending from the first surface to the second surface;
   a first conductor circuit formed in the concave portion of the first insulating layer, the first conductor circuit comprising a wiring having a width tapered from the first surface of the first insulating layer toward the second surface of the first insulating layer;
   a conductive pad formed on the second surface of the first insulating layer and configured to connect to an electronic device;
   a first via conductor formed in the aperture of the first insulating layer and connecting the conductive pad on the second surface of the first insulating layer to the first conductor circuit formed in the concave portion of the first insulating layer in the first surface of the first insulating layer;
   a second insulating layer having a first surface and a second surface on an opposite side of the first surface of the second insulating layer, the second insulating layer having a concave portion formed in the first surface of the second insulating layer and an aperture extending from the first surface of the second insulating layer to the second surface of the second insulating layer;
   a second conductor circuit formed in the concave portion of the second insulating layer, the second conductor circuit comprising a wiring having a width tapered from the first surface of the second insulating layer toward the second surface of the second insulating layer; and
   a second via conductor formed in the aperture of the second insulating layer and connecting the second conductor circuit formed in the concave portion of the second insulating layer in the first surface of the second insulating layer to the first conductor circuit formed in the concave portion of the first insulating layer in the first surface of the first insulating layer,
   wherein the second insulating layer is laminated to the first surface of the first insulating layer.

2. The printed wiring board according to claim 1, wherein an end of the first conductor circuit that faces the second surface of the first insulating layer is arc-shaped.

3. The printed wiring board according to claim 1, further comprising:
   a third insulating layer having a first surface and a second surface on an opposite side of the first surface of the third insulating layer, the third insulating layer having an aperture extending from the first surface of the third insulating layer to the second surface of the third insulating layer;
   a third conductor circuit formed on the first surface of the third insulating layer; and
   a third via conductor formed in the aperture of the third insulating layer and configured to interconnect the third conductor circuit to the second conductor circuit,
   wherein the third insulating layer is laminated onto the first surface of the second insulating layer.

4. The printed wiring board according to claim 1, wherein a surface of the first conductor is substantially flush with the first surface of the first insulating layer, and a surface of the second conductor is substantially flush with the first surface of the second insulating layer.

5. The printed wiring board according to claim 1, wherein the first concave portion and the aperture of the first insulating layer are roughened.

6. The printed wiring board according to claim 1, wherein the conductive pad includes a protective film formed on an exposed surface of the conductive pad, and a solder member formed over the protective film.

7. A printed wiring board, comprising:
   a first insulating layer having a first surface and a second surface on an opposite side of the first surface of the first insulating layer, the first insulating layer having a first concave portion in the first surface, a second concave portion in the second surface and an aperture extending from the first surface to the second surface;
   a first conductive circuit formed in the first concave portion of the first insulating layer, the first conductive circuit comprising a wiring having a width tapered from the first surface of the first insulating layer toward the second surface of the first insulating layer;
   a conductive pad formed in the second concave portion and configured to connect to an electronic device; and
   a first via conductor formed in the aperture of the first insulating layer and connecting the conductive pad formed in the second concave portion in the second surface of the first insulating layer to the first conductive circuit formed in the first concave portion in the first surface of the first insulating layer.

8. The printed wiring board according to claim 7, further comprising:
   a second insulating layer having a first surface and a second surface on an opposite side of the first surface of the second insulating layer, the second insulating layer having a third concave portion in the first surface of the second insulating layer and an aperture extending from the first surface of the second insulating layer to the second surface of the second insulating layer;
   a second conductive circuit formed in the third concave portion, the second conductive circuit comprising a wiring having a width tapered from the first surface of the second insulating layer toward the second surface of the second insulating layer; and
   a second via conductor formed in the aperture of the second insulating layer and connecting the second conductive circuit formed in the third concave portion in the first surface of the second insulating layer to the first conductive circuit formed in the first concave portion in the first surface of the first insulating layer,
   wherein the second insulating layer is laminated to the first surface of the first insulating layer.

9. The printed wiring board according to claim 8, wherein a surface of the first conductor is substantially flush with the first surface of the first insulating layer and a surface of the second conductor is substantially flush with the first surface of the second insulating layer.

10. The printed wiring board according to claim 8, further comprising:
   a third insulating layer having a first surface and a second surface on an opposite side of the first surface of the third insulating layer, the third insulating layer having an aperture extending from the first surface of the third insulating layer to the second surface of the third insulating layer;
   a third conductor circuit formed on the first surface of the third insulating layer; and
   a third via conductor formed in the aperture of the third insulating layer and connecting the third conductor circuit formed on the first surface of the third insulating layer to the second conductor circuit formed in the third concave portion in the first surface of the second insulating layer,
   wherein the third insulating layer is laminated to the first surface of the second insulating layer.

11. The printed wiring board according to claim 10, wherein a line:space ratio of the first conductor circuit is smaller than a line:space ratio of the third conductor circuit.

12. The printed wiring board according to claim 7, wherein an end of the first conductor circuit that faces the second surface of the first insulating layer is arc-shaped.

13. The printed wiring board according to claim 7, wherein the first concave portion and the aperture in the first insulating layer are roughened.

14. The printed wiring board according to claim 7, wherein a protective layer is formed on an outer surface of the conductive pad.

15. A printed wiring board, comprising:
   a first insulating layer having a first surface and a second surface on an opposite side of the first surface, the first insulating layer having a concave portion formed in the first surface and an aperture extending from the first surface to the second surface;
   a first conductor circuit formed in the concave portion of the first insulating layer, the first conductor circuit comprising a wiring having a width tapered from the first surface of the first insulating layer toward the second surface of the first insulating layer;
   a conductive pad formed on the second surface of the first insulating layer and configured to connect to an electronic device; and
   a first via conductor formed in the aperture of the first insulating layer and connecting the conductive pad on the second surface of the first insulating layer to the first conductor circuit formed in the concave portion of the first insulating layer in the first surface of the first insulating layer,
   wherein the conductive pad includes a protective film formed on an exposed surface of the conductive pad, and a solder member formed over the protective film.

16. The printed wiring board according to claim 15, wherein an end of the first conductor circuit that faces the second surface of the first insulating layer is arc-shaped.

17. The printed wiring board according to claim 15, further comprising:
   a second insulating layer having a first surface and a second surface on an opposite side of the first surface of the second insulating layer, the second insulating layer having a concave portion formed in the first surface of the second insulating layer and an aperture extending from the first surface of the second insulating layer to the second surface of the second insulating layer;
   a second conductor circuit formed in the concave portion of the second insulating layer, the second conductor circuit comprising a wiring having a width tapered from the first surface of the second insulating layer toward the second surface of the second insulating layer;
   a second via conductor formed in the aperture of the second insulating layer and connecting the second conductor circuit formed in the concave portion of the second insulating layer in the first surface of the second insulating layer to the first conductor circuit formed in the concave portion of the first insulating layer in the first surface of the first insulating layer;
   a third insulating layer having a first surface and a second surface on an opposite side of the first surface of the third insulating layer, the third insulating layer having an aperture extending from the first surface of the third insulating layer to the second surface of the third insulating layer;
   a third conductor circuit formed on the first surface of the third insulating layer; and
   a third via conductor formed in the aperture of the third insulating layer and configured to interconnect the third conductor circuit to the second conductor circuit,
   wherein the second insulating layer is laminated to the first surface of the first insulating layer, and the third insulating layer is laminated onto the first surface of the second insulating layer.

18. The printed wiring board according to claim 15, further comprising:
   a second insulating layer having a first surface and a second surface on an opposite side of the first surface of the second insulating layer, the second insulating layer having a concave portion formed in the first surface of the second insulating layer and an aperture extending from the first surface of the second insulating layer to the second surface of the second insulating layer;
   a second conductor circuit formed in the concave portion of the second insulating layer, the second conductor circuit comprising a wiring having a width tapered from the first surface of the second insulating layer toward the second surface of the second insulating layer; and
   a second via conductor formed in the aperture of the second insulating layer and connecting the second conductor circuit formed in the concave portion of the second insulating layer in the first surface of the second insulating layer to the first conductor circuit formed in the concave portion of the first insulating layer in the first surface of the first insulating layer,
   wherein the second insulating layer is laminated to the first surface of the first insulating layer, a surface of the first conductor is substantially flush with the first surface of the first insulating layer, and a surface of the second conductor is substantially flush with the first surface of the second insulating layer.

19. The printed wiring board according to claim 15, wherein the first concave portion and the aperture of the first insulating layer are roughened.

* * * * *